(12) United States Patent
Kushnir et al.

(10) Patent No.: US 8,138,658 B2
(45) Date of Patent: Mar. 20, 2012

(54) PIEZOELECTRIC-FERROELECTRIC ACTUATOR DEVICE

(75) Inventors: Uri Kushnir, Haifa (IL); Oded Rabinovitch, Haifa (IL)

(73) Assignee: Technion Research & Development Foundation Ltd., Haifa (IL)

( * ) Notice: Subject to any disclaimer, the term of this patent is extended or adjusted under 35 U.S.C. 154(b) by 0 days.

(21) Appl. No.: 12/864,911

(22) PCT Filed: Jan. 28, 2009

(86) PCT No.: PCT/IL2009/000107
§ 371 (c)(1),
(2), (4) Date: Jul. 28, 2010

(87) PCT Pub. No.: WO2009/095911
PCT Pub. Date: Aug. 6, 2009

(65) Prior Publication Data
US 2010/0320868 A1    Dec. 23, 2010

Related U.S. Application Data

(60) Provisional application No. 61/023,983, filed on Jan. 28, 2008.

(51) Int. Cl.
H01L 41/08    (2006.01)
(52) U.S. Cl. .................... 310/317; 310/328; 310/366
(58) Field of Classification Search .................. 310/328, 310/358, 359
See application file for complete search history.

(56) References Cited

U.S. PATENT DOCUMENTS

| | | | | |
|---|---|---|---|---|
| 2,860,265 A | * | 11/1958 | Mason | 310/328 |
| 4,384,230 A | * | 5/1983 | Wisner | 310/317 |
| 4,721,447 A | * | 1/1988 | Erckmann | 425/141 |
| 4,772,817 A | * | 9/1988 | Aida et al. | 310/328 |
| 5,128,544 A | * | 7/1992 | Iwatsuki | 850/1 |
| 5,790,156 A | * | 8/1998 | Mutton et al. | 347/71 |
| 5,969,464 A | * | 10/1999 | Nakano et al. | 310/328 |
| 7,598,659 B2 | * | 10/2009 | Yura et al. | 310/358 |
| 2006/0049715 A1 | | 3/2006 | Onishi | |

FOREIGN PATENT DOCUMENTS

| | | |
|---|---|---|
| DE | 19905726 | 8/2000 |
| DE | 10041333 | 3/2002 |
| WO | WO 94/27330 | 11/1994 |
| WO | WO 2007/012484 | 2/2007 |
| WO | WO 2009/095911 | 8/2009 |

OTHER PUBLICATIONS

International Search Report Dated Jun. 15, 2009 From the International Searching Authority Re.: Application No. PCT/IL2009/000107.
Written Opinion Dated Jun. 15, 2009 From the International Searching Authority Re.: Application No. PCT/IL2009/000107.
International Preliminary Report on Patentability Dated Aug. 12, 2010 From the International Bureau of WIPO Re.: Application No. PCT/IL2009/000107.

* cited by examiner

*Primary Examiner* — Mark Budd

(57)    ABSTRACT

An actuator device is disclosed. The actuator device comprises a stack of piezoelectric-ferroelectric active layers separated by surface electrodes. At least a few of the surface electrodes are independently addressable such that at least two active layers are biasable by different voltages. In an embodiment of the invention, at least a few of the voltages induce a nonlinear ferroelectric effect.

23 Claims, 11 Drawing Sheets
(5 of 11 Drawing Sheet(s) Filed in Color)

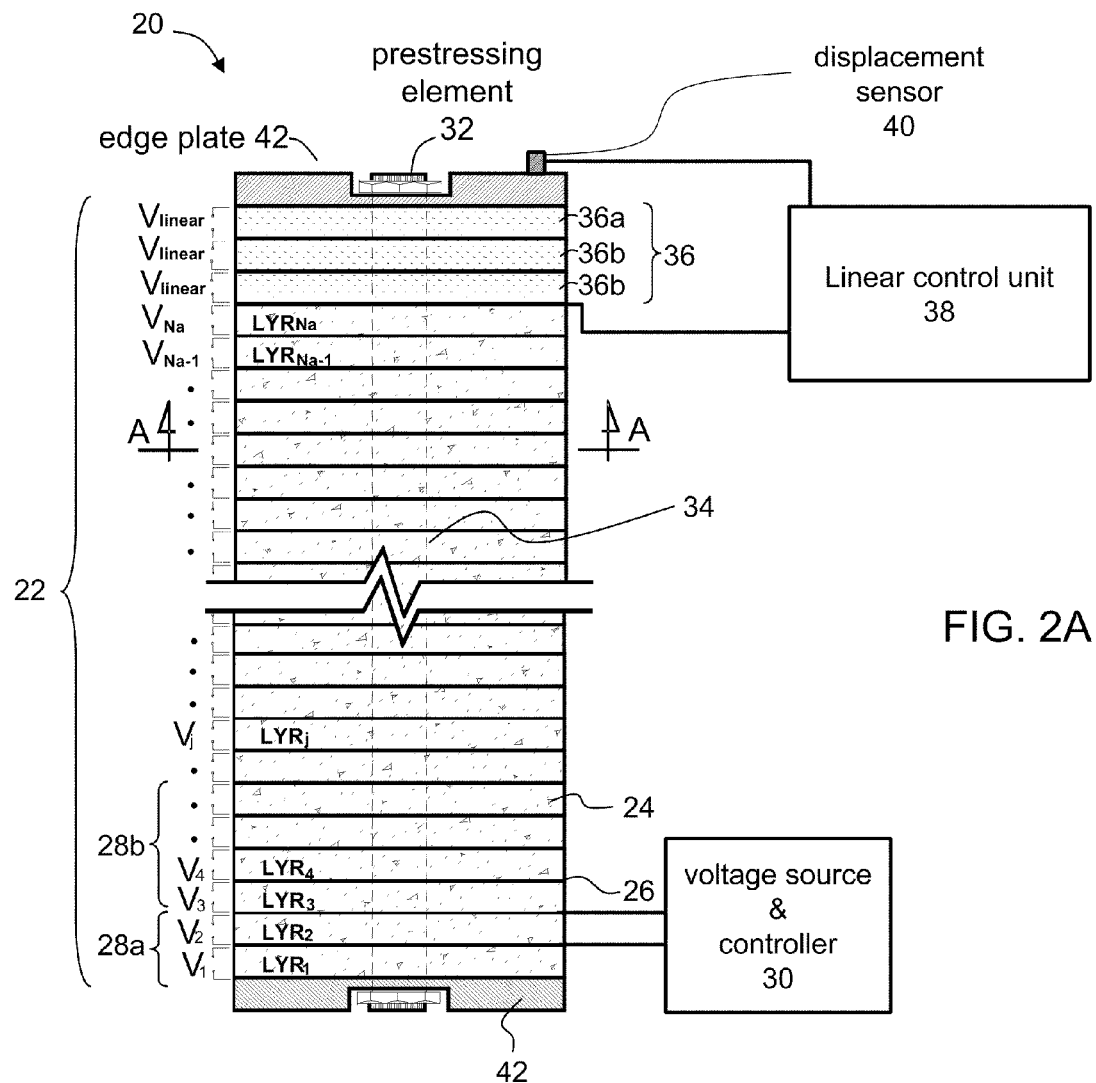
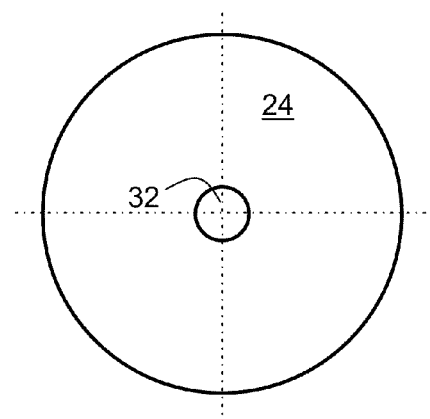
FIG. 2A
FIG. 2B
section A-A

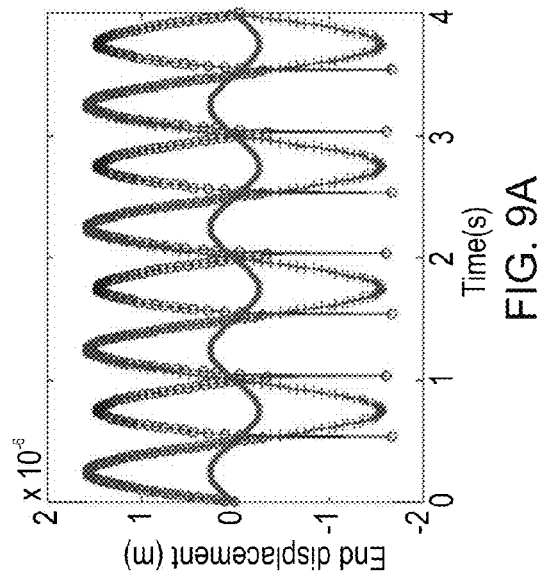
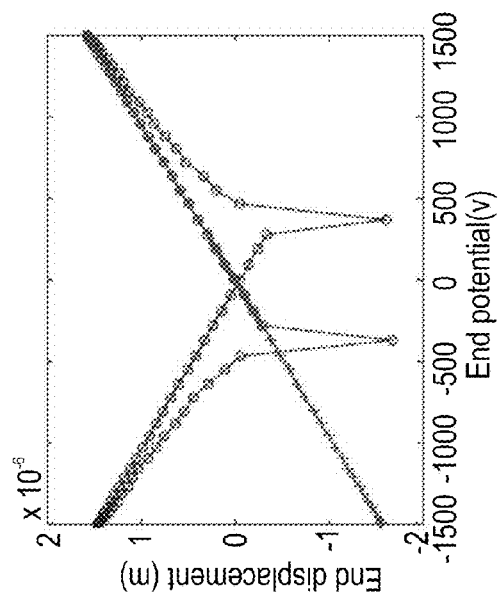
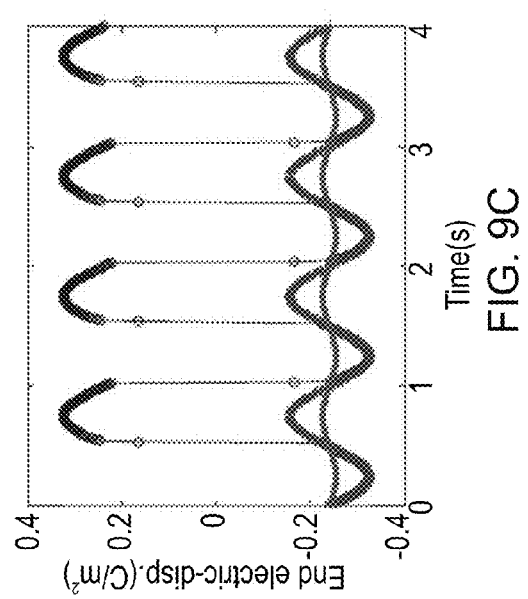
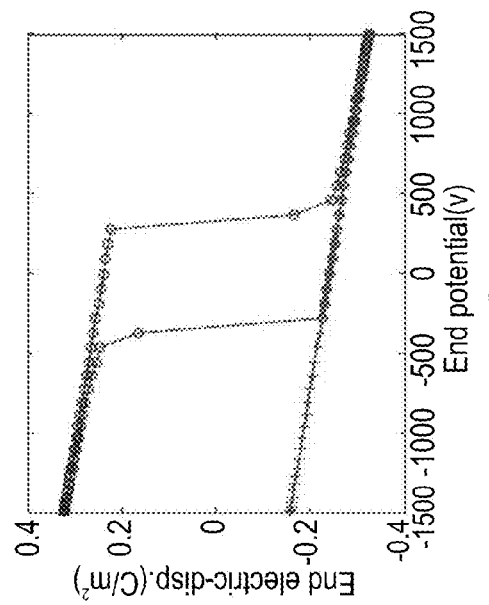
FIG. 9A
FIG. 9B
FIG. 9C
FIG. 9D

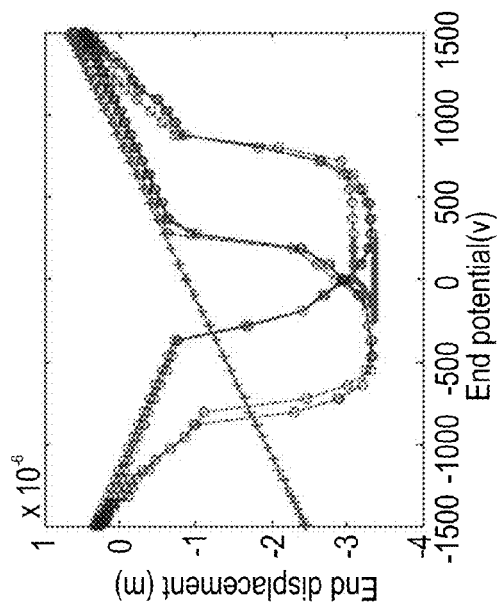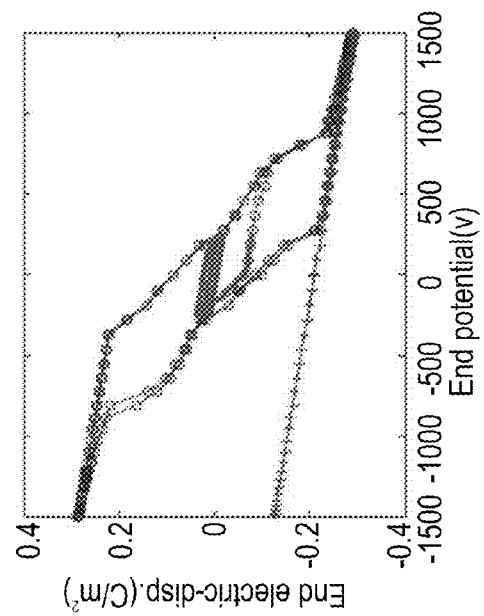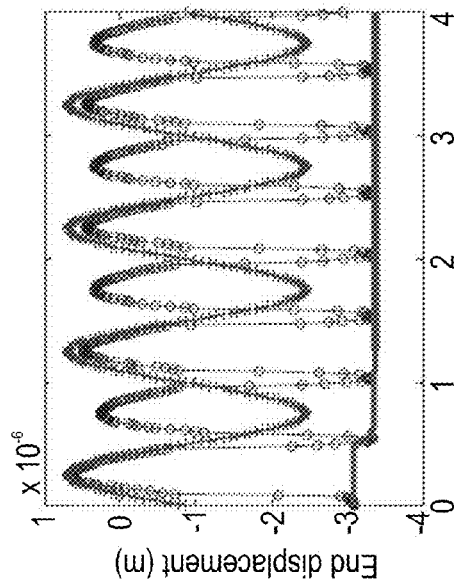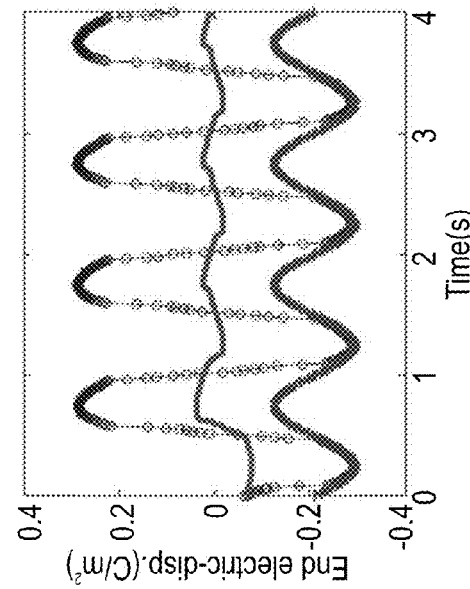
FIG. 10A
FIG. 10B
FIG. 10C
FIG. 10D

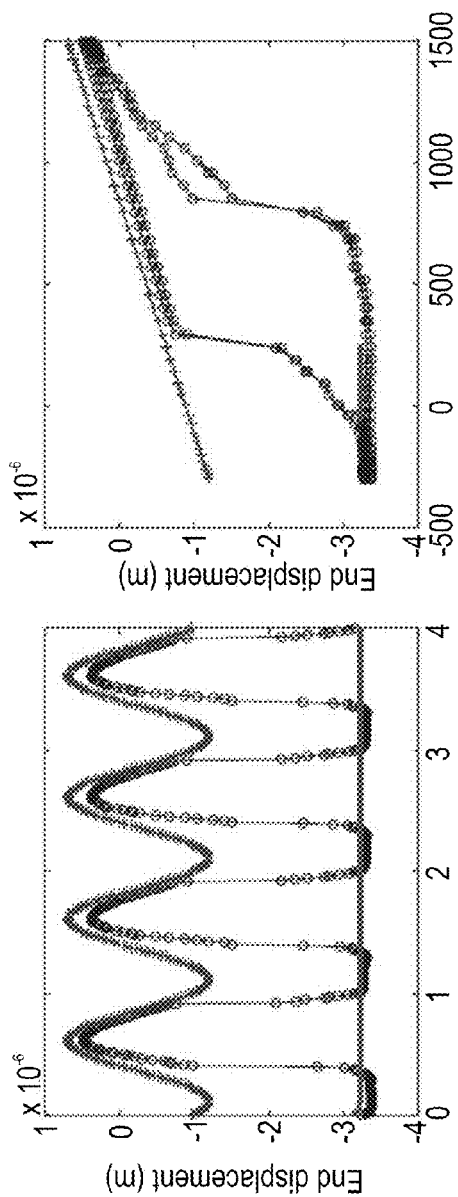
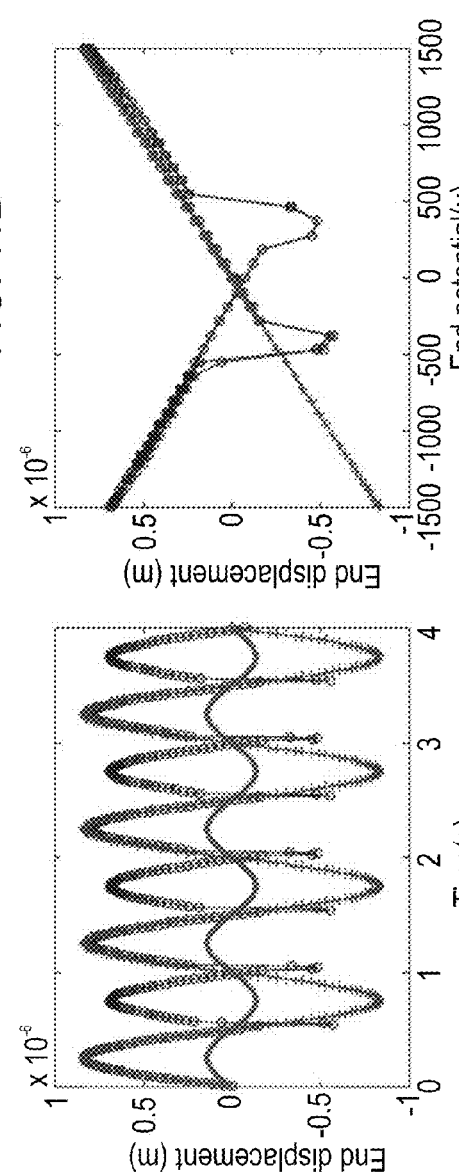
FIG. 11A
FIG. 11B
FIG. 12A
FIG. 12B

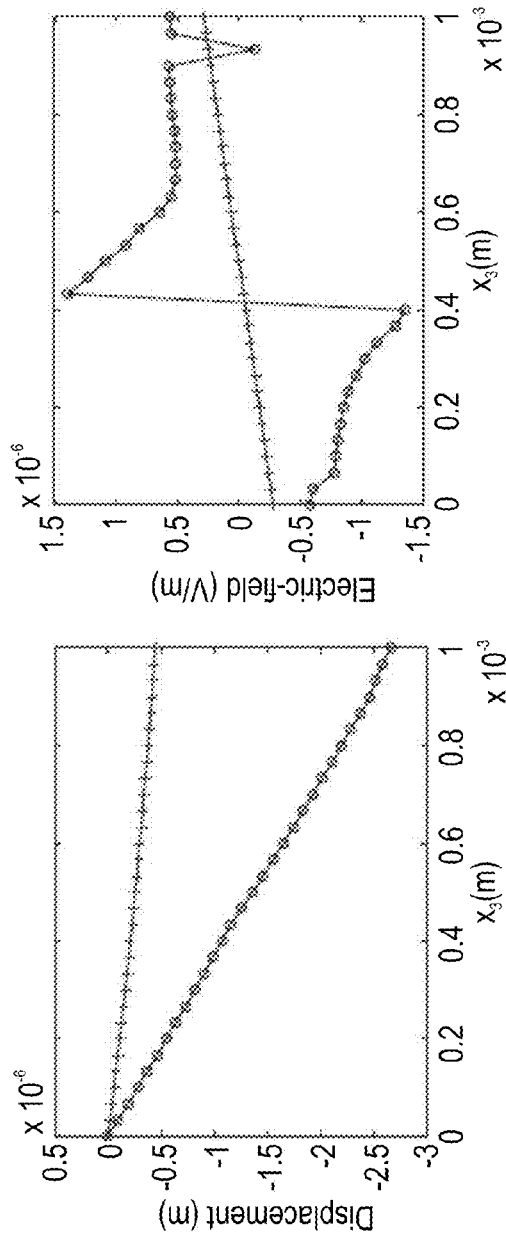
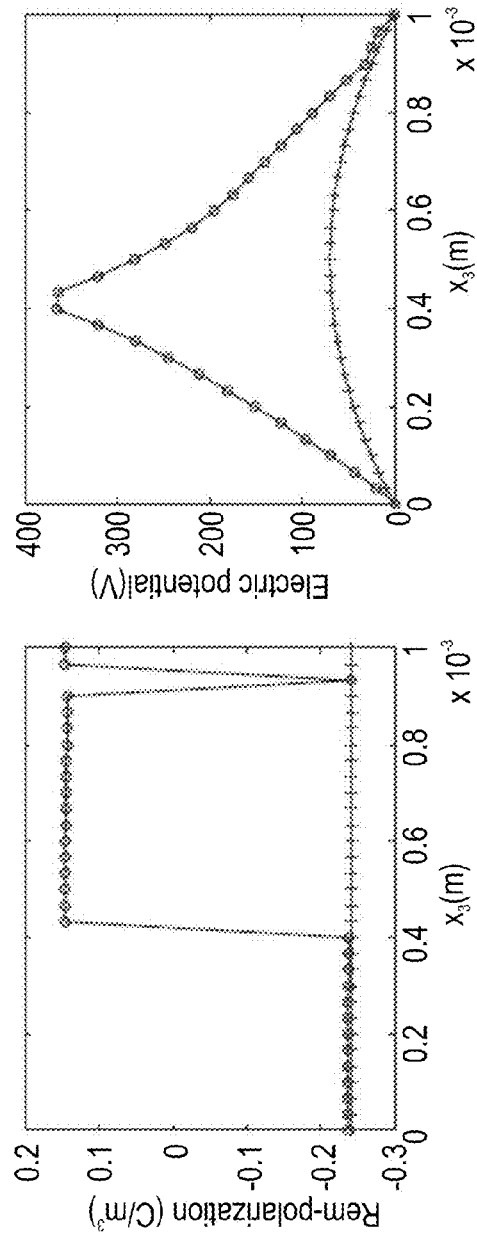
FIG. 14B
FIG. 14D
FIG. 14A
FIG. 14C

PIEZOELECTRIC-FERROELECTRIC ACTUATOR DEVICE

RELATED APPLICATION/S

This Application is a National Phase of PCT Patent Application No. PCT/IL2009/000107 having International filing date of Jan. 28, 2009, which claims the benefit of U.S. Provisional Patent Application No. 61/023,983 filed on Jan. 28, 2008. The contents of the above Applications are all incorporated herein by reference. The contents of U.S. Patent Application No. 61/023,983 are incorporated by reference as if fully set forth herein.

FIELD AND BACKGROUND OF THE INVENTION

The present invention, in some embodiments thereof, relates to an actuator and, more particularly, but not exclusively, to a piezoelectric-ferroelectric actuator device operating, at least in part, in the nonlinear ferroelectric range.

An actuator is a mechanical device for moving or controlling another device. The actuator generally provides force or motion in response to an applied stimulus. Many commonly used actuators are inductive in nature. However, from a purely theoretical point of view, piezoelectric actuators, which are capacitive in nature, exhibit much more desirable mechanical and electrical characteristics. Piezoelectric materials are characterized by an ability to deform mechanically in response to an applied electric field, as a result of the inverse piezoelectric effect. Piezoelectric actuators have a very efficient coupling of energy from electrical charge to mechanical strain, which results in a high bandwidth, large force output, fast actuation stroke and low resistive heating. The actuator stiffness is determined by the modulus of the material used for the actuator, rather than by an inherently weak magnetic coupling.

Piezoelectric stack actuators are formed of several layers of piezoelectric material. An electric field is applied to these actuators in the thickness direction, and the resulting force and displacement are also in the thickness direction. Actuators of this type provide sufficient force at the expense of displacement, and are suitable for many applications such as those required micro- and nano-positioning, as well as for many other mechanical and structural applications. Heretofore, piezoelectrics have been employed for minor control, ink jet nozzles, ultrasonic medical devices, high frequency audio speakers, miniature valves and the like.

During electrical excitation in the linear piezoelectric range, the amount of displacement which a piezoelectric material undergoes is relatively small. Piezoelectric actuators are therefore characterized by short travel range (also known in the literature as "stroke").

Several studies have been directed to investigate the ferroelectric properties of some piezoelectric materials such as PZT and PMN [Mitrovic et al., (2001), "Response of piezoelectric stack actuators under combined electro-mechanical loading", International Journal of Solids and Structures 38(24-25):4357-4374; Chaplya et al., (2001), "Dielectric and piezoelectric response of lead zirconate-lead titanate at high electric and mechanical loads in terms of non-180 degrees domain wall motion" Journal of Applied Physics 90 (10): 5278-5286; Shilo, et al., (2007) "A model for large electrostrictive actuation in ferroelectric single crystals" International Journal of Solids and Structures, 44(6):2053-2065; Burcsu et al., (2004) "Large electrostrictive actuation of barium titanate single crystals", Journal of the Mechanics and Physics of Solids 52(4):823-846].

The ferroelectric range of a piezoelectric-ferroelectric material is characterized by self heating, material parameter degradation, fatigue after millions of cycles and complex relations between the strain, electric displacement, stress and electrical field. These complex elations are nonlinear, non-monotonic and hysteretic. Additionally, in the ferroelectric range, there is an abrupt directional change of the spontaneous polarization and strain of the unit cells (the so called "domain switching phenomenon"). As a result, the strains and the electrical displacement, as well as the elastic, dielectric, and piezoelectric tensors, become strongly dependent on the domain state of the grain and they may discontinuously vary through the mechanical and/or electrical loading process. Thus, although relatively large strains can evolve within the ferroelectric range, traditional actuation devices do not operate in this range since the nonlinear behavior and discontinuous variations are hard to be controlled.

Additional background art includes Balke et al., (1997) "Fatigue of Lead Zirconate Titanate Ceramics I: Sesquipolar Loading" Journal of the American Ceramic Society, 90(4): 1088-1093; Chaplya et al., (2006), "Durability properties of piezoelectric stack actuators under combined electromechanical loading", Journal of Applied Physics 100(12): 124111-1:124111-13; and Lesieutre et al.

SUMMARY OF THE INVENTION

According to an aspect of some embodiments of the present invention there is provided an actuator device. The actuator device comprises a stack of piezoelectric-ferroelectric active layers separated by surface electrodes, wherein at least a few of the surface electrodes are independently addressable such that at least two active layers are biasable by different voltages.

According to some embodiments of the invention the actuator device further comprises a voltage source and controller being in electrical communication with the at least few surface electrodes and configured to generate the voltages.

According to an aspect of some embodiments of the present invention there is provided a method, which comprises: applying at least two different voltages to an actuator device which comprises a stack of piezoelectric-ferroelectric active layers separated by surface electrodes, such that the at least two voltages respectively bias at least two different active layers.

According to some embodiments of the invention the voltages induce a nonlinear ferroelectric effect on the at least two layers.

According to some embodiments of the invention the voltages inducing the nonlinear ferroelectric effect are applied momentarily.

According to some embodiments of the invention the at least one layer is applied by a voltage inducing a nonlinear ferroelectric effect in the layer, and at least one layer is applied by a voltage inducing a linear inverse piezoelectric effect in the layer.

According to some embodiments of the invention the voltage inducing the nonlinear ferroelectric effect is applied momentarily, and the voltage inducing the linear inverse piezoelectric effect is applied continuously.

According to some embodiments of the invention a number of layers applied by the voltage inducing the linear inverse piezoelectric effect is selected so as to compensate a minimal discontinuous displacement generated by the nonlinear ferroelectric effect.

According to some embodiments of the invention the actuator device further comprises a loop control unit for controlling voltages applied to induce the linear inverse piezoelectric effect in response to displacements generated by the nonlinear ferroelectric effect.

According to some embodiments of the invention the method further comprises controlling voltages applied to induce the linear inverse piezoelectric effect according to displacements generated by the nonlinear ferroelectric effect.

According to some embodiments of the invention the displacements are sensed by an external sensor configured to sense the displacements.

According to some embodiments of the invention the displacements are sensed by at least one piezoelectric-ferroelectric layer which is part of the stack and which is not electrically biased during the sensing.

According to some embodiments of the invention the actuator device further comprises a prestressing element positioned in physical contact with the layers and selected to apply mechanical stress on the layers.

According to some embodiments of the invention the stack of piezoelectric-ferroelectric active layers is interposed between a top edge plate and a bottom edge plate, and wherein the actuator device further comprises a prestressing element positioned in physical contact with at least one of the edge plates and selected to apply mechanical stress on the plate.

According to some embodiments of the invention the prestressing element is shaped as a bar introduced along a thickness direction of the stack through bores formed in the layers and the surface electrodes.

According to some embodiments of the invention the prestressing element is made of a material which is elastic under a characteristic deformation range of the piezoelectric-ferroelectric layers.

According to some embodiments of the invention the prestressing element is selected to apply on the layers a stress within a predetermined range of stresses defined between an upper bound and a lower bound, the upper bound corresponding to a polarized domain state of the layers and the lower bound corresponding to a depoled domain state of the layers.

According to some embodiments of the invention the stack is electrically partitioned to a plurality of sub-stacks of piezoelectric-ferroelectric layers in a manner such that at least two sub-stacks are electrically decoupled, but for each sub-stack all surface electrodes of the sub-stack are electrically coupled.

According to some embodiments of the invention at least a few sub-stacks have equal number of layers.

According to some embodiments of the invention at least a few sub-stacks have different numbers of layers.

According to some embodiments of the invention there are N sub-stacks each having a different number of layers which equals $2^k$, k being an integer satisfying $k \leq N$.

According to an aspect of some embodiments of the present invention there is provided a system. The system comprises an actuatable device and an actuator device such as the actuator device described herein.

According to some embodiments of the invention the actuatable device comprises an optical alignment device.

According to some embodiments of the invention the actuatable device comprises a pump injector.

According to some embodiments of the invention the actuatable device comprises an interferometric dilatometer.

According to some embodiments of the invention the actuatable device comprises a deformable mirror.

According to some embodiments of the invention the actuatable device comprises a deformable optical grid.

According to some embodiments of the invention the actuatable device comprises a microscope stage.

According to some embodiments of the invention the actuatable device comprises a guide device.

According to some embodiments of the invention the actuatable device comprises a cutting device.

According to some embodiments of the invention the actuatable device comprises a valve.

According to some embodiments of the invention the actuatable device comprises a VTR head.

According to some embodiments of the invention the actuatable device comprises a swing CCD image sensor.

According to some embodiments of the invention the actuatable device comprises a micro-angle adjusting device.

According to some embodiments of the invention the actuatable device comprises an inkjet head.

According to some embodiments of the invention the actuatable device comprises a dot-matrix printer head.

According to some embodiments of the invention the actuatable device comprises a relay.

According to some embodiments of the invention the actuatable device comprises an ultrasound generator.

According to some embodiments of the invention the actuatable device comprises an aerodynamic steering wing.

According to some embodiments of the invention the actuatable device comprises a rotor blade.

According to some embodiments of the invention the actuatable device comprises a welding device.

According to some embodiments of the invention the actuatable device comprises a suspension device.

According to some embodiments of the invention the actuatable device comprises a vibration dumping system.

According to some embodiments of the invention the actuatable device comprises a parallel robotic system.

According to some embodiments of the invention the actuatable device comprises a hard disk drive head supporter arm.

According to some embodiments of the invention the actuatable device comprises a nanofocusing Z-Drive.

According to some embodiments of the invention the actuatable device comprises an optic fiber.

According to some embodiments of the invention the actuatable device comprises a switch.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 1A is a schematic illustration of an active piezoelectric-ferroelectric layer interposed between two surface electrodes.

Figure 1A:
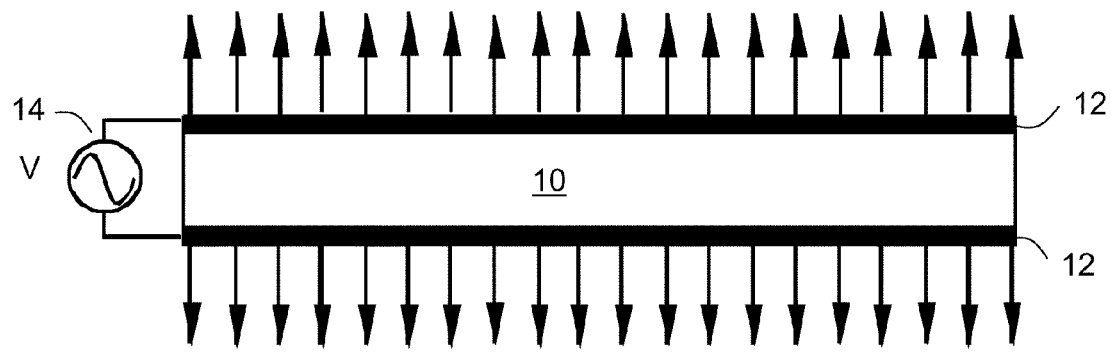
Figure 1B:
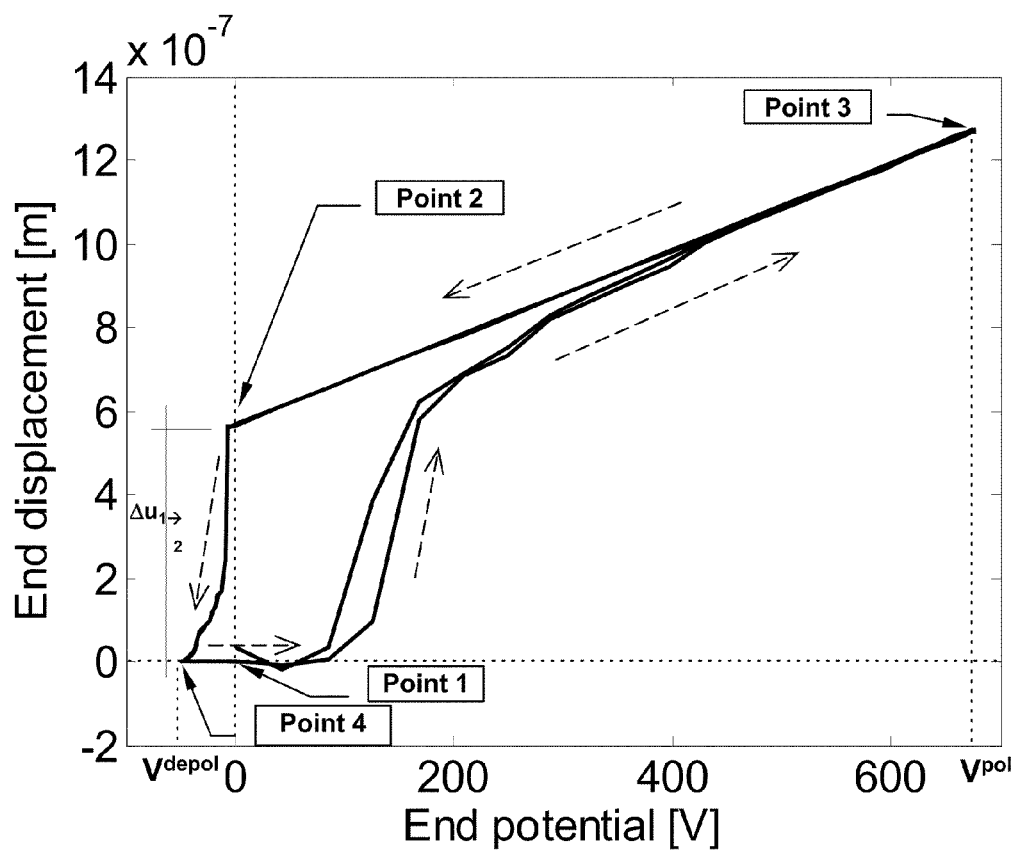

FIG. 1B is a hysteresis curve describing the displacement of a single 0.25 mm thick active layer as a function of the potential difference which generates the electric field therein. The hysteresis curve is characteristic to a PLZT layer under compressive stress of 16 MPa. The potential difference is from −50V to 675V.

FIGS. 2A-B are schematic illustrations of a side view (FIG. 2A) and a cross-sectional view along the line A-A (FIG. 2B) of an actuator device, according to various exemplary embodiments of the present invention.

Figure 3:
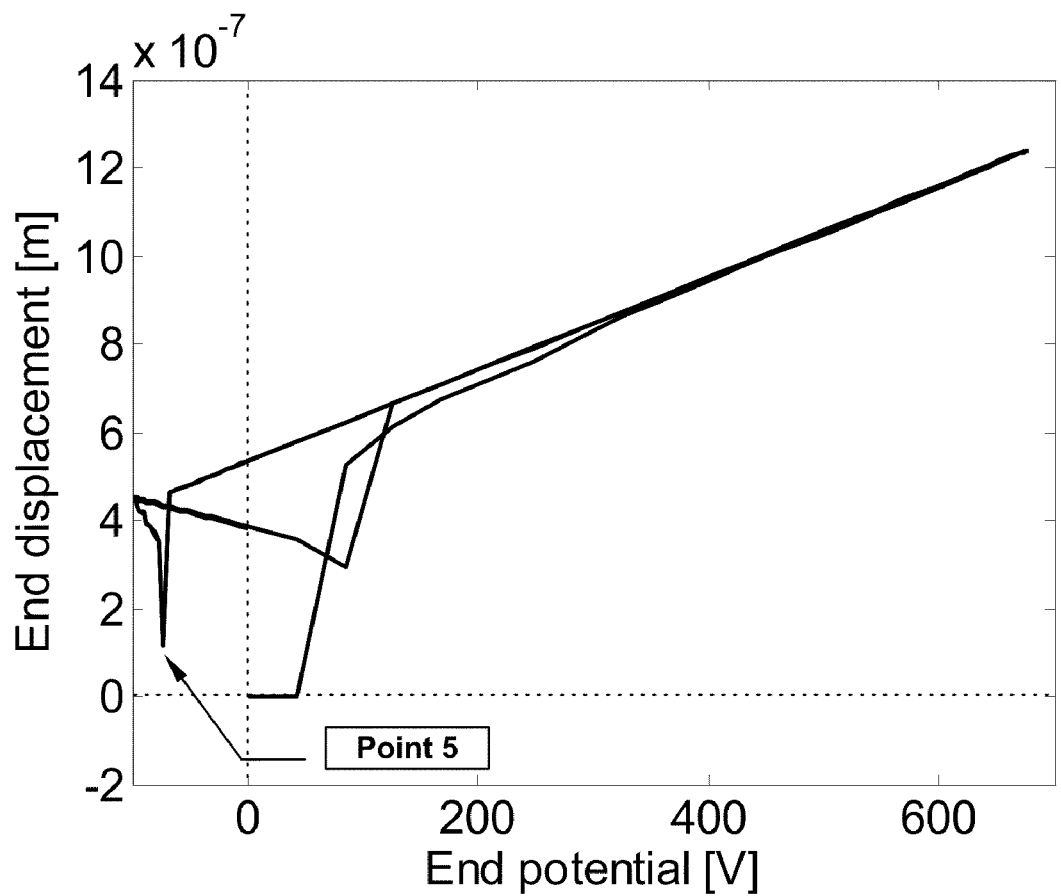

FIG. 3 shows a response of an active piezoelectric-ferroelectric layer in the absence of compressive stress.

Figure 4:
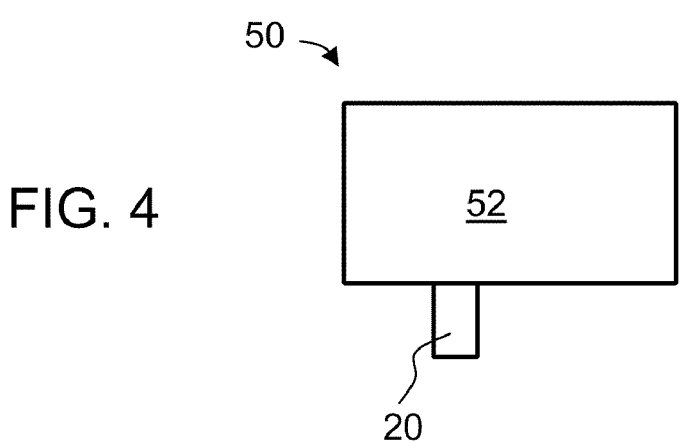

FIG. 4 is a schematic illustration of a system 50, according to various exemplary embodiments of the present invention.

FIGS. 5A-D show voltage distributions along a stack of layers. The voltages were calculated in accordance with some embodiments of the present invention for an actuator operated against a dead weight.

FIGS. 6A-D show voltage distributions along a stack of layers. The voltages were calculated in accordance with some embodiments of the present invention for an actuator operated against linear Spring.

Figure 7A:
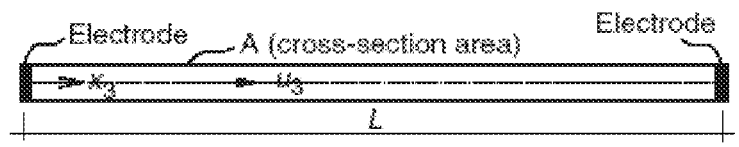
Figure 7B:
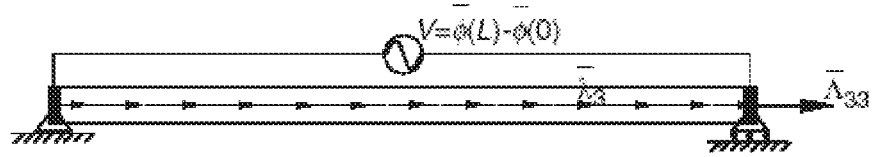
Figure 7C:
Figure 7D:
Figure 7E:

FIGS. 7A-E schematically illustrate notation and sign convention used in a model employed for calculating displacements and voltages, according to various exemplary embodiments of the present invention. FIG. 7A illustrates geometry, coordinates, and displacements, FIG. 7B illustrates external loads, FIG. 7C illustrates prescribed displacements, FIG. 7D illustrates stresses and electrical displacements, and FIG. 7E illustrates stress and electrical displacement resultants.

Figure 8A:
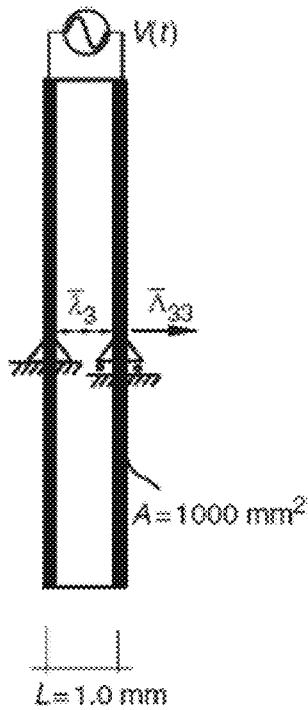
Figure 8B:
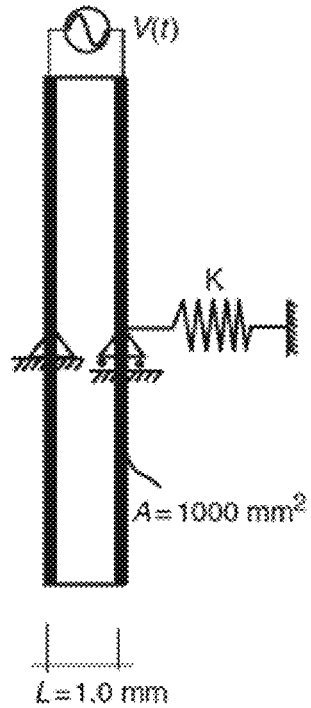

FIGS. 8A-B schematically illustrate geometry and loads used in a numerical study performed in accordance with some embodiments of the present invention. FIG. 8A correspond to cases in which electrical actuation or electrical actuation combined with mechanical load were simulated, and FIG. 8B correspond to a case in which electrical actuation against a linear spring was simulated.

FIGS. 9A-D show results of a numerical study in which electrical actuation without mechanical load was simulated. FIG. 9A shows displacement versus pseudo time, FIG. 9B shows displacement versus voltage, FIG. 9C shows electric displacement versus pseudo time, and FIG. 9D shows electric displacement versus voltage. Legend: black=nonlinear theory, blue=linear theory, red=nonlinear response to actuation in the linear range.

FIGS. 10A-D show results of a numerical study in which mechanical load and nonbiased electrical actuation were simulated. FIG. 10A shows displacement versus pseudo time, FIG. 10B shows displacement versus voltage, FIG. 10C shows electric displacement versus pseudo time, and FIG. 10D shows electric displacement versus voltage. Legend: black=nonlinear theory, blue=linear theory, red=nonlinear response to actuation in the linear range.

FIGS. 11A-B show results of a numerical study in which mechanical load and biased electrical actuation were simulated. FIG. 11A shows displacement versus pseudo time, and FIG. 11B shows displacement versus voltage. Legend: black=nonlinear theory, blue=linear theory, red=nonlinear response to actuation in the linear range.

FIGS. 12A-B show results of a numerical study in which linear spring load and electrical actuation were simulated. FIG. 12A shows displacement versus pseudo time, and FIG. 12B shows displacement versus voltage. Legend: black=nonlinear theory, blue=linear theory, red=nonlinear response to actuation in the linear range.

Figure 13B:
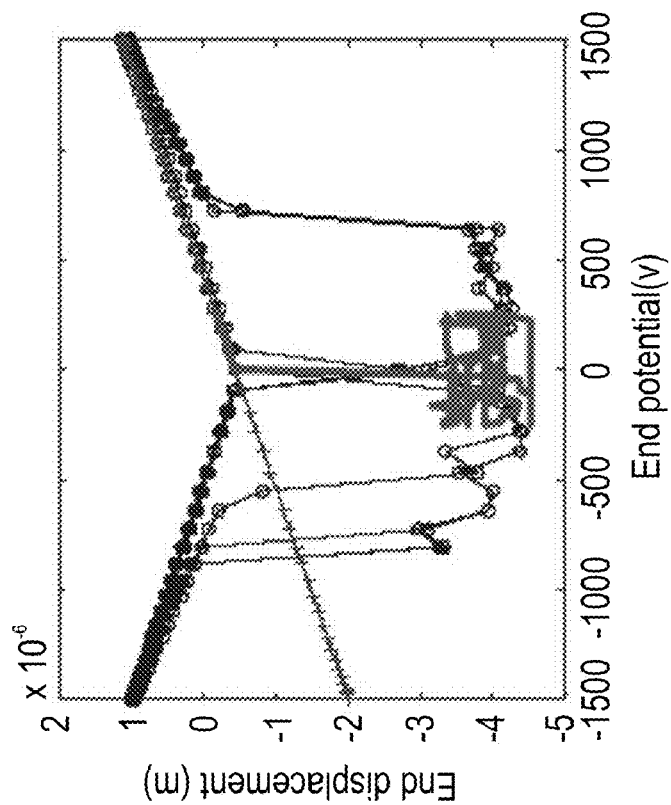
Figure 13A:
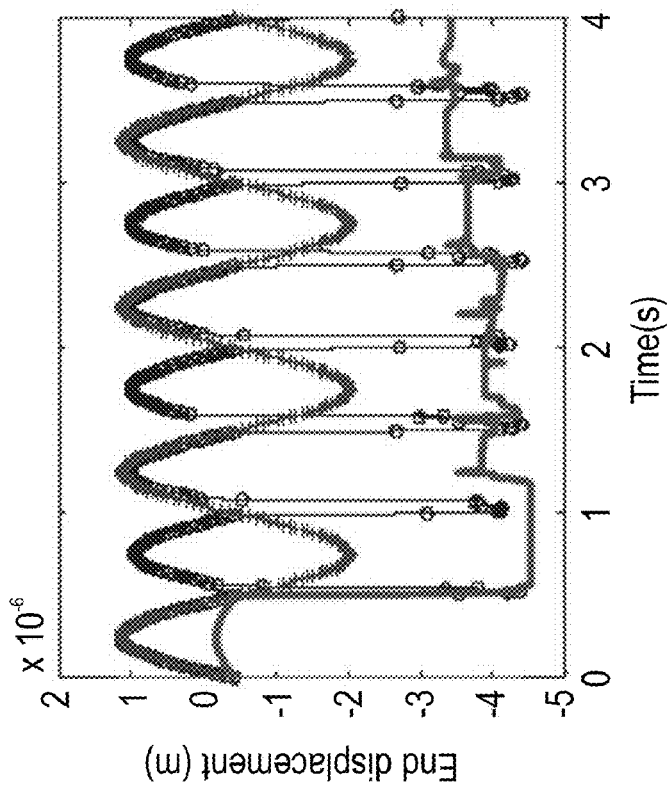

FIGS. 13A-B show results of a numerical study in which electrical actuation and uniformly distributed mechanical load were simulated. FIG. 13A shows displacement versus pseudo time, and FIG. 13B shows displacement versus voltage. Legend: black=nonlinear theory, blue=linear theory, red=nonlinear response to actuation in the linear range.

FIGS. 14A-D show distributions of displacement (FIG. 14A), electric field (FIG. 14B), remanent polarization (FIG. 14C), and electric potential (FIG. 14D) along a depth of an active layer at t=2.5 sec, as calculated in a numerical study a numerical study in which electrical actuation and uniformly distributed mechanical load were simulated.

DESCRIPTION OF SPECIFIC EMBODIMENTS OF THE INVENTION

The present invention, in some embodiments thereof, relates to an actuator and, more particularly, but not exclusively, to a piezoelectric-ferroelectric actuator device operating, at least in part, in the nonlinear ferroelectric range.

For purposes of better understanding some embodiments of the present invention, as illustrated in the drawings, reference is first made to the construction and operation of a piezoelectric layer as illustrated in FIGS. 1A and 1B.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Referring now to the drawings, FIG. 1A is a schematic illustration of an active piezoelectric-ferroelectric layer 10 interposed between two surface electrodes 12. Electrodes 12 are electrically connected to a voltage source 14. When electrodes 12 are applied with voltage bias, an electric field is generated within layer 10, and the thickness of layer 10 is changed via the inverse piezoelectric effect. The thickness change is illustrated in FIG. 1A by a series of up pointing and down pointing arrows. A typical stack actuator is formed of a plurality of layers like layer 10 stacked along their thickness direction such that two adjacent layers in the stack are separated by a surface electrode like one of electrodes 12. In traditional stack actuators, all surface electrodes are electrically coupled, such that the same bias is applied to all electrodes and the same electric field is generated to all the active layers in the stack. The overall stroke of the actuator equals the sum of displacements of all the layers. In a traditional stack actuator with several hundreds of layers, the displacement of one layer is of the order of 0.1% of the thickness of the layer. Typical layer thickness may vary from 0.1 millimeter to 0.25 millimeter. The overall stroke of a traditional stack actuator is therefore no more that 0.1% of its length.

Electric charge in a piezoelectric material may be induced by an external electric field, or by a stress via the piezoelectric effect. Similarly the mechanical strain in a piezoelectric material may be induced by an electric field via the inverse piezoelectric effect, or by an external stress via Hooke's law. Thus, an electric field generated in a piezoelectric layer results in a longitudinal strain parallel to the field. When the layer is under compressive stress, the resulting longitudinal strain is the sum of the piezoelectric strain, and the opposing mechanical strain. Within the working range in which the piezoelectric effect is reversible, the relation between the longitudinal strain and the electric field is generally linear.

Ferroelectric materials possess an effective electric dipole moment in the absence of an external field. In a ferroelectric material, there are regions in which all dipoles are oriented along the same direction resulting in a spontaneous polarization. The regions of the material with uniformly oriented spontaneous polarization are called ferroelectric domains, and the region between two adjacent domains is called a domain wall. In a ferroelectric material, the spontaneous polarization can assume two or more equilibrium states, and an electric field and/or mechanical stress can switch between these states in a non-linear hysteretic manner. A transition between different polarization states by means of an electric field is known as domain switching.

A piezoelectric-ferroelectric active layer has both piezoelectric and ferroelectric properties.

FIG. 1B is a hysteresis curve describing the displacement of a single 0.25 mm thick active layer as a function of the potential difference which generates the electric field therein. The hysteresis curve is characteristic to a PLZT layer under compressive stress of 16 MPa. The potential difference is from −50V to 675V.

Points 1 and 2 on the hysteresis curve correspond to different domain states, and the transition between these points is accompanied by the aforementioned domain switching.

Point 1 corresponds to a depoled domain state of the active layer where the combination of the electrical and mechanical (compressive) loads encourages switching towards the plane perpendicular to the $x_3$ axis. Under these conditions, the net polarization and the piezoelectric tensors vanish, small changes in the applied potential difference do not yield a change of the displacement and the slope of the displacement-voltage curve near Point 1 tends to zero.

Point 2 corresponds to a fully polarized domain state of the active layer where the spontaneous polarization of the domains is aligned as closely as the lattice directions allow to the direction of polarization along $x_3$ axis. At this state, the application of electrical field in the $x_3$ direction cannot trigger further switching. This state is referred to herein as a "stable polarized domain state". The electrical load yields a stable elongation due to the linear piezoelectric response which is illustrated by the straight line between Point 2 and Point 3 in FIG. 1B. The operation principle of traditional actuators is based on this linear piezoelectric range while avoiding any domain switching. This is because the domain switching is a highly nonlinear process which is very difficult to control or predict.

While conceiving the present invention it was found that transition between a depoled domain state and a polarized domain state can be used for actuation when different layers in the stack are biased by different voltages.

FIGS. 2A-B are schematic illustrations of a side view (FIG. 2A) and a cross-sectional view along the line A-A (FIG. 2B) of an actuator device 20, according to various exemplary embodiments of the present invention. Actuator 20 comprises a stack 22 of piezoelectric-ferroelectric active layers 24 separated by surface electrodes 26. The number layers in stack 22 is preferably at least 100, more preferably at least 500, more preferably at least 1000. Stack 22 can be interposed between two edge plates 42. One or both plates 42 can be deluged to engage a system (not shown) for actuating the system.

Active layers 24 can be made of any material known to exhibit piezoelectric and ferroelectric properties. Representative examples including, without limitation, lanthanum doped lead zirconate titanate (PLZT), barium titanate, TRS600FGHD (PZT-5H equivalent), PZT (PIC-151) and the like. The type of piezoelectric-ferroelectric material can be selected according to the application for which actuator device is employed. For example, PLZT and barium titanate single crystals are known to provide a relatively large strain output, but also exhibit a degradation of electromechanical properties under cyclic loading. Thus, PLZT and barium titanate are particularly suitable for low frequency applications that are not expected to undergo a large number of loading cycles (e.g., below $10^7$ cycles). Representative Examples of such applications include, without limitation, optical positioning device, optical alignment device, a deformable mirror, a deformable optical grid, a microscope stage, a guide device, a cutting device, a micro-angle adjusting device, a relay and a wafer positioning device.

TRS600FGHD (PZT-5H equivalent) and PZT (PIC-151) are particularly suitable for applications which are expected to operate in cyclic modes. Representative Examples of such applications include, without limitation, a pump injector, a valve, a dot-matrix printer head, an inkjet head, an ultrasound generator, an electromechanical motor, a fuel injector, a miniature pump, a vibration controller device, a swing CCD image sensor and an active noise reduction device.

It is expected that during the life of a patent maturing from this application many relevant materials exhibiting piezoelectric and ferroelectric properties will be developed and the scope of the term piezoelectric-ferroelectric is intended to include all such new technologies a priori.

At least a few of surface electrodes 26 are independently addressable such that at least two active layers are biasable by different voltages. The different active layers are denoted in FIG. 2A by $LYR_j$, and the different voltage biases are denoted $V_j$, j=1, 2, . . . . Although every layer in stack 22 is shown as being biased by a different voltage, this need not necessarily be the case, since, for some applications stack is electrically partitioned to a plurality of sub-stacks in a manner such that at least two sub-stacks are electrically decoupled, but for each sub-stack all surface electrodes of the sub-stack are electrically coupled. Representative examples of such sub-stacks are generally shown at 28a and 28b. In the present embodiment, all layers in sub-stack 28a (two layers in the present example) are stimulated by the same voltage bias, and all layers in sub-stack 28b (four layers in the present example)

are also stimulated by the same voltage bias, but the bias of sub-stack 28a differs from the bias of sub-stack 28b.

In various exemplary embodiments of the invention actuator device 20 further comprises a voltage source and controller 30 which is in electrical communication with surface electrodes 26 for generating the voltages. For clarity of presentation electrical connections between controller 30 and electrodes 26 are only shown for two electrodes, but one of ordinary skill in the art would appreciated that other connections also exist. In use, two or more different voltages are applied such that at least two voltages respectively bias at least two different active layers.

In various exemplary embodiments of the invention the voltages induce a nonlinear ferroelectric effect on the layers. This can be done, for example, by operating the active layers in two domain states, e.g., the depoled domain state (see Point 1 in FIG. 1B) and a polarized domain state (see Point 2 or any other point along the straight line connecting Point 2 and Point 3 in FIG. 1B). For example, the transition from the fully polarized domain state (Point 2) to the depoled domain state (Point 1) decreases the thickness of the layer, and thus shortens the stack actuator. Conversely, transition from the fully polarized domain state to the depoled domain state increases the thickness of the layer and elongates the actuator. A further increase of the displacement can be achieved by applying an additional bias that induces a linear inverse piezoelectric effect (see the straight line from Point 2 to Point 3).

Note that both Points 1 and 2 are observed under a zero electrical field. However, they correspond to different levels of strain. Thus, transition between these points yields a discontinuous variation in the displacement at the end of the layer. However, although actuator device can comprise many layers the overall discontinuity in the displacement is less than the multiplication of the number of layers by the displacement of a single layer, since the use of different biases to different layers in accordance with preferred embodiments of the present invention limits the number of layers which experience the transition. Thus, the present embodiments prevent the discontinuous variation from being substantially amplified.

It should be understood that although the present description is provided with reference to the domain states depicted in FIG. 1B, it is not intended to limit the scope of the present invention to piezoelectric-ferroelectric layers whose hysteresis curve are the curve shown in FIG. 1B. Thus, various embodiments of the invention include piezoelectric-ferroelectric layers having other hysteresis curves. Yet, the piezoelectric-ferroelectric layers of the present embodiments have at least two different domain states with zero applied voltage, which preferably include a depoled domain state and a polarized domain state.

Although the displacement range of actuator device 20 is not absolutely continuous, the magnitude of the discontinuity is limited to the displacement jump of a single layer or a single sub-stack of layers operated under the same voltage, which is much smaller than the displacement jump of the whole stack.

When stack 22 is electrically partitioned to sub-stacks, there is more than one way to define the partitions. Thus, for example, in some embodiments at least a few sub-stacks have equal number of layers and in some embodiments at least a few sub-stacks have different numbers of layers. The partitions can also be done according to a scheme which facilitates different combinations between various sub-stacks. For example, in various exemplary embodiments of the invention stack 22 comprises N sub-stacks each having a different number of layers which equals $2^k$, where k is an integer satisfying k N. With such layout, any desired combination of activated layers can be achieved, while maintaining a minimal displacement step and a relatively small number of sub-stacks. As a representative and non-limiting example, consider a stack of 1023 identical layers where the discontinuous displacement of each layer equals h. Suppose further that the stack is electrically partitioned to 10 sub-stacks where the ith sub-stack has $2^{i-1}$ layers (i=1, . . . , 10). With such configuration, a judicious operation scheme can generate an overall displacement which can be any integer multiplication of h. For example, activation of sub-stacks 1, 3 and 8 generate an overall displacement of 133 h.

Following is a description of embodiments in which the displacement range of the actuation is substantially continues. These embodiments are particularly useful for high precision applications.

Hence, in the present embodiments, the displacement discontinuity is bridged over by a linear piezoelectric operation of a small group of layers generally shown at 36. Layers 36 can be switched to the stable branch between Points 2 and 3 and then biase to induce linear inverse piezoelectric effect along the straight line connecting Points 2 and 3. The displacement discontinuity is fully compensated, when the displacement range between Points 2 and 3 multiplied by the number $N_{lin}$ of layers 36 is larger than the discontinuity between Points 1 and 2 of a single layer or a group of layers biased by the same voltage. In this embodiment actuator device 20 exhibits an extended and continuous operation. For smaller number of layers 36, the displacement discontinuity is partially compensated. This embodiment is useful for applications in which continuous operation is not essential.

Optionally, layers 36 are operated via a control loop. In this embodiment, actuator device 20 comprises a linear control unit 38 which controls the voltage applied to layers 36. Control unit 38 is "linear" in the sense that it controls layers which are biased so as to induce a linear inverse piezoelectric effect. Unit 38 receives information pertaining to the overall displacement generated by the nonlinear ferroelectric effect and selects the voltages applied to layers 36 so as to at least partially compensate the discontinuity. It is to be understood that although unit 38 is shown in FIG. 2A as a separate unit, need not necessarily be the case, since unit 38 can be embedded in or enacted by controller 30. The discontinuous displacement can be sensed in more than one way.

In some embodiments of the present invention, the voltage applied to layers 36 is numerically calculated (e.g., using analytic expressions as further detailed in the Examples section that follows) and, based on the difference between the desired displacement and the reading of sensor 40, unit 38 selects a correction to the voltage applied to layer 36.

In some embodiments of the present invention, a closed loop control is employed. In these embodiments, a displacement sensor senses the displacement of layers 24 and transmits signals indicative of the displacement to unit 38, which in turn controls the voltage applied to layers 36. The displacement sensor can be an external sensor 40 contacting one of edge plates 42, as schematically illustrated in FIG. 2A. The displacement sensor can also be enacted by one or more of layers 36, e.g., layer 36a. In this embodiment, layer 36a is electrically decoupled from the other layer (layers 36b and 36c in the present example) and is constituted to operate as a sensing unit. Thus, via the piezoelectric effect, layer 36a transmits signals indicative of the displacement of layers 24 to unit 38. In response to these signals, unit 38 controls the voltage applied to layers 36b and 36c which act as actuating units via the inverse piezoelectric effect. This embodiment is particularly useful when actuator device includes a prestressing element, as further detailed hereinunder.

In some embodiments of the present invention, an open loop control is employed. In these embodiments, layers 36 function as sensing units and actuating units in an alternating manner. Specifically, in one part of the control cycle, layers 36 operate as sensing units which generate signals in response to a strain via the piezoelectric effect. The signal is received by unit 38. In another part of the control cycle, unit 38 allows biasing of layers 36 which then operate via the inverse piezoelectric effect as actuating units. This embodiment is particularly useful when actuator device includes a prestressing element, as further detailed hereinunder.

For a given layer, the transition between the domain states can be achieved by applying a sufficiently high positive potential difference. For example, for the PLZT layer described in FIG. 1B, a positive potential difference of about 675 V is sufficient to fully polarize the layer and to bring it from Point 1 to Point 3. Reducing the potential difference to zero brings the layer to Point 2. The shift from the fully polarized domain state at Point 2 back to the depoled domain state at Point 1 can be done by applying a negative potential difference, combined with a mechanical compressive stress. For example, a negative potential difference of about −50 V brings the active layer from Point 2 to Point 4. Decreasing the negative potential difference back to zero brings the active layer from Point 4 to Point 1.

In various exemplary embodiments of the invention the voltages that are applied to induce nonlinear ferroelectric effect are applied momentarily. This is because the nonlinear ferroelectric effect is a manifestation of domain switching whereby a domain experiences a transition between two spontaneous polarization states which are generally states of equilibrium. In various exemplary embodiments of the invention the voltages that are applied to induce linear inverse piezoelectric effect are applied continuously, since the strain resulting from the linear inverse piezoelectric effect is not accompanied by domain switching.

It is appreciated that the depoled domain state is stable only in the presences of mechanical compressive stress. FIG. 3 shows the response of an active piezoelectric-ferroelectric layer in the absence of compressive stress. In FIG. 3, Point 5 represents the depoled domain state. In the absence of the compressive stress, this domain state is not stable and an electrical field of small magnitude induces switching. In various exemplary embodiments of the invention it is desirable to have certain level of compressive stress on actuator device 20. Such compressive stress may results from the external load against which the actuator is operated. For example, when the actuator operates in the presence of strong compressive loads, the external load can provide a compressive stress which is sufficient for stabilizing the depoled domain state.

However, the actuator device of the present embodiments is operative also in systems in which the external compressive loading is minor. This can be done by prestressing the actuator. In these embodiments, actuator device 20 comprises a prestressing element 32 positioned in physical contact with layers 24 and/or with one or both edge plates 42 and selected to apply mechanical stress on the layers and/or edge plate(s). Preferably, the mechanical stress applied by element 32 is sufficient for stabilizing the depoled domain state of the layers. Also contemplated are configurations in which a combination of the mechanical stress applied by element 32 by itself is not sufficient for stabilizing the depoled domain state, but the combination of stresses applied by element 32 and by the external load against which actuator device 20 is operated is sufficient for achieving the desired stabilization.

The shape and location of prestressing element 32 is not limited. In some embodiments of the present invention element 32 is shaped as a bar introduced along the thickness direction of stack 22 through bores 34 formed in layers 24 and surface electrodes 26.

Prestressing element 32 is preferably made of a material which has linear elasticity under the characteristic deformation range of the layers. In various exemplary embodiments of the invention prestressing element 32 is flexible. For example, when the layers are made of PLZT, element 32 can be characterized by a stiffness of from about 350 N/mm to about 450 N/mm. Flexibility of element 32 reduces the changes in the prestressing force due to the deformation of actuator device 20. Representative examples for elements suitable for prestressing element 32 include, without limitation, an element made of is vulcanized rubber composition or a material of similar properties, and a spring (e.g., a metal spring) which can be constituted to have the desired stiffness and elasticity.

Prestressing element 32 is selected to apply on the layers a stress within a predetermined range of stresses defined between an upper bound (maximal prestress) and a lower bound (minimal prestress), where the upper bound preferably corresponds to a polarized domain state of the layers and the lower bound preferably correspond to a depoled domain state of layers. In various exemplary embodiments of the invention actuator device 20 is typically designed to operate within a predetermined range of external loads. In these embodiments, the combination of the prestresses applied by element 32 and by an external load corresponds to the above polarized and depoled domain states. Specifically, the maximal prestress is selected such that under the peak combined compressive force (maximal prestress and maximal possible external load), the polarized domain state is stable in the absence of an applied voltage; and the minimal prestress is selected such that under the minimal combined compressive force (minimal prestress and minimal or zero external load) the depoled domain state is stable in the absence of an applied voltage.

In embodiments in which compensation of displacement discontinuities is employed, prestressing element 32 can facilitate the sensing of the overall displacement. The tensile force in prestressing element 32 changes with the displacements induced by the nonlinear ferroelectric effect. This change can be sensed by layers 36, which generate electrical signal via the piezoelectric effect. After suitable calibration, these signals can provide a measure of the elongation of the stack. Linear control unit 38 received these signals and allows biasing of layers 36 which then operate as actuating units.

The present embodiments use the increased strain actuation of the material rather than a mechanical apparatus which increases the displacement on the expense of the applied force. The direct operation against the nonlinear ferroelectric material enables the handling of compressive forces that yields stresses which are equal to or even larger than the coercive stress times the layer's area. In the linear piezoelectric range, ferroelastic depolarization limits the compressive loading to the coercive stress. Thus, the upper bound of the work output (per unit volume) of a traditional linear piezoelectric actuator operated against a dead load is the coercive stress times the piezoelectric strain interval. For example, when the operation is limited to the piezoelectric range between Points 2 and 3 and the actuator works against a dead weight (constant load) that yields the coercive stress (approximately −22 MPa for PLZT), the calculated work output per volume equals 38.57 kJ/m$^3$. On the other hand, in the actuator device of the present embodiments, work against strong compressive loads allows for a reduction in the level of prestress and an increase of the work output due to the increased stroke. For example, when the actuator device of the present embodiments operates against a constant load that yields the coercive stress, the calculated work output per volume from point 1 to point 3 equals 91.37 kJ/m³, which is more than twice as much. The work output of the actuator device of the present embodiments further grows when the external compressive stresses are larger than the coercive stress.

Reference is now made to FIG. 4 which is a schematic illustration of a system 50, according to various exemplary embodiments of the present invention. System 50 comprises an actuatable device 52 and actuator device 20 described herein. In use, device 20 actuates device 52 according to an actuation scheme which is suitable for the operation of device 52.

Device 52 can be any device which requires actuation for the purpose of its operation. Representative examples for actuatable device 52 include, without limitation an optical alignment device, a pump injector, an interferometric dilatometer, a deformable mirror, a deformable optical grid, a microscope stage, a guide device, a cutting device, a valve, VTR head, a swing CCD image sensor, a micro-angle adjusting device, an inkjet head, a dot-matrix printer head, a relay, an ultrasound generator, an aerodynamic steering wing, a rotor blade, a welding device, a suspension device, a vibration dumping system, a parallel robotic system (e.g., a tripod, a hexapod), a hard disk drive head supporter arm, a nanofocusing Z-Drive, a robotic arms, an optic fiber, an electrical switch, and an optical switch.

As used herein the term "about" refers to ±10%.

The word "exemplary" is used herein to mean "serving as an example, instance or illustration." Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments." Any particular embodiment of the invention may include a plurality of "optional" features unless such features conflict.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

Example 1

Exemplified Operation Scheme

The present example describes a method which can be used according to some embodiments of the present invention for determining an operation scheme of the actuator device. The operation scheme can include the voltage applied to each layer or group of layers (e.g., sub-stacks) such that the overall displacement at the tip of the actuator is $u_3^d$.

The method begins by determining the optimal domain state of each layer or sub-stack, and assigning for each layer or sub-stack a working point which corresponds to a domain state. In the present example, the working points correspond to a depoled domain state with zero applied voltage and a fully polarized domain state with zero applied voltage (see, e.g., Points 1 and 2 of FIG. 1B). These working points are referred to hereinunder as working point 1 and working point 2, respectively.

Once the working points are assigned, the method determine, for each layer or sub-stack which is assigned with a working point corresponding to the fully polarized domain state, whether or not to apply additional voltage to this layer or sub-stack to induce the linear inverse piezoelectric effect. Additionally, the method determines whether or not to apply voltage to layers 36 (see FIG. 2A).

The method is further detailed below.

Assignment of Working Points

Consider a stack actuator consisting of $N_a$ individually controlled active layers (not including layers 36 (if present). For simplicity, the method refers to the use of individually controlled layers rather than to groups of layers. The skilled person, provided with the following description, would know how to adjust the method for the case in which the stack is electrically partitioned to a plurality of sub-stacks.

Each layer is designated $LYR_j$ where $j=1, \ldots, N_a$ denotes the relative position of the layer in the stack. The preliminary data needed for assigning the working points is a vector $u_3=\{u_3^i\}$, $i=1, \ldots, N_a+1$, which can be calculated in advance thereby avoiding extensive and complex real time calculations. The ith entry in this vector is the displacement of the actuator tip when the root of the actuator is fixed, i−1 layers are fully polarized and subjected to zero voltage (Point 2 in FIG. 1B), and $N_a-(i-1)$ layers are depoled and subjected to zero voltage (Point 1 in FIG. 1B). The displacement is measured relatively to the case where all the layers are depoled and subjected to the initial prestress force and to zero potential difference. Thus $u_3^1=0$. Each entry in the vector is generally given by the expression:

$$u_3^i = (N_a - (i-1))\frac{(\overline{A}_{33} - \overline{A}_{33}^0)l}{[C_{3333}]_1 A} + $$
$$(i-1)\left(\Delta u_{1 \to 2} + \frac{(\overline{A}_{33} - \overline{A}_{33}^0)l}{[C_{3333}]_2 A}\right) + N_{Lin}\frac{(\overline{A}_{33} - \overline{A}_{33}^0)l}{[C_{3333}]_2 A} \quad (EQ. 1)$$

where $[C_{3333}]_1$ is the elastic modulus of an active layer at working point 1 (i.e. the depoled domain state with zero applied voltage), $\overline{A}_{33}$ is the axial force at the tip of the actuator (which force is a function of the displacement along the stack, i.e., $\overline{A}_{33}=\overline{A}_{33}(u_3^1)$), $\overline{A}_{33}^0$ is the initial prestress force, l is the thickness of an active layer at working point 1, A is the cross section of the actuator, $\Delta\mu_{1 \to 2}$ is the discontinuous displacement (displacement jump) of a layer when switching from working point 1 to working point 2, $[C_{3333}]_2$ is the elastic modulus of an active layer at working point 2, and $N_{Lin}$ is the number of layers in the linear section.

Note, that l, $\Delta u_{1 \to 2}$, $[C_{3333}]_1$, and $[C_{3333}]_2$ can be physically measured or they can be calculated using an analytical model for the simulation of the response of an active layer (to this end see, e.g., Hwang et al (1998) "The simulation of switching in polycrystalline ferroelectric ceramics" J. Appl. Phys. 84(3): 1530-1540; and Kushnir U. and Rabinovitch O., (2007) "Grain orientation scattering in nonlinear constitutive modeling of piezoelectric-ferroelectric materials", Journal of Intelligent Material Systems and Structures 18(11): 1149-1163, the contents of which are hereby incorporated by reference). In the following description these parameters are calculated under the assumption of quasi-static operation.

In order to find the desired distribution of domain states of the active layers, the desired displacement $u_3^d$ is compared with the entries of the vector $u_3$. The domain state of the layers is determined by finding $u_3^k$, which is the entry of $u_3$ that satisfies:

$$u_3^k \leq u_3^d \text{ and } u_3^d < u_3^{k+1} \quad (EQ. 2)$$

Once k is found from EQ. (2), the desired number of fully polarized active layers is $$N_p^{new} = k - 1 \quad (EQ. 3)$$

The number of active layers that need to be switched from point 1 to point 2, $N_p$, is given by $$N_p = N_p^{new} - N_p^{old} \quad (EQ. 4)$$

where $N_p^{old}$ is the number of polarized active layers at the current state.

Accordingly, in case $N_p > 1$, the layers numbered $N_p^{old}+1$ to $N_p^{new}$ are subjected to an increase in the electrical potential difference to the positive value $V^{pol}$, which corresponds to Point 3 in FIG. 1B. Then, the potential difference is decreased to zero and Point 2 is reached. In case $N_p < 1$, the layers numbered $N_p^{new}+1$ to $N_p^{old}$ are subjected to a decrease in the electrical potential difference to the negative value $V^{depol}$, which corresponds to Point 4 in FIG. 2. After depolarization, the negative potential difference $V^{depol}$ is increased back to zero and Point 1 is reached. The values $V^{pol}$ and $V^{depol}$ can be either measured, or determined using an analytical model for the simulation of the response of an active layer (see, e.g. Hwang et al (1998) and Kushnir and Rabinovitch (2007) supra). $V_{pol}$ is preferably determined under the maximal external mechanical load within the travel range of the actuator device of the present embodiments and $V^{depol}$ is preferably determined under the minimal external mechanical load within the travel range of the actuator device of the present embodiments.

Further Application of Voltage to Induce Linear Piezoelectric Effect

The desired displacement can be fine tuned by applying a voltage difference to layers 36 (see FIG. 2A):

$$V_{linear} = \frac{-1}{d_{333}N_{Lin}} \quad (EQ. 5)$$
$$\left\{u_3^d - u_3^k - [\overline{A}_{33}(u_3^d) - \overline{A}_{33}(u_3^k)]\frac{l}{A}\left[\frac{(N_l + N_p)}{[C_{3333}]_2} + \frac{(N_a - N_p)}{[C_{3333}]_1}\right]\right\}$$

where $V_{linear}$ is the applied voltage difference, $d_{333}$ is the axial piezoelectric coefficient that is defined by the slope of the displacement-voltage line between Points 2 and 3 divided by the depth of the layer, and $N_{Lin}$ is the number of layers at 36. The travel range can be further increased after the polarization of all layers by inducing linear inverse piezoelectric effect to the layers which are now polarized ($N_p^{new} = N_a$). In that case, Eq. (5) takes the following form:

$$V_{linear} = -\frac{1}{d_{333}(N_{Lin} + N_a)} \quad (EQ. 6)$$
$$\left\{u_3^d - u_3^{Na+1} - [\overline{A}_{33}(u_3^d) - \overline{A}_{33}(u_3^{Na+1})]\frac{1}{A}\left[\frac{(N_{Lin} + N_a)}{[C_{3333}]_2}\right]\right\}$$

Closed Loop Control

For some materials, the maximal prestress for which the fully polarized state is stable under zero voltage may not be large enough for a complete depolarization of the material. As a result, the polarization of the material does not entirely vanish at Point 1. This means that changes in the combined compressive force (which is a function of the desired displacement) may induce slight variations of the domain state at Point 1. In addition, some deviation from the straight line that governs the linear piezoelectric effect (between Point 2 and 3) may also be involved. However, the deviation associated with these effects are of small magnitude, and can easily be overcome by a closed loop correction to the linear voltage $V_{linear}$. The closed loop control is preferably applied to the linear part of the actuator device (layers 36), and can employ any procedure for a closed loop linear control, such as, but not limited to, the procedure described in U.S. Published Application Nos. 20050219302 and 20060152879, and U.S. Pat. Nos. 5,384,507, 6,046,525, 6,707,230, 7,317,274. Note that $\Delta u_{1 \to 2}$ is calculated with a compressive force equal to the initial prestress force, which is equal to or slightly smaller than the minimal axial force anticipated under operation of the actuator. Hence, the voltage distribution determined by the method of the present embodiments leads to a displacement that may be slightly smaller (but not larger) than the desired displacement. The desired displacement can be achieved by increasing $V_{linear}$ according to a closed loop control procedure. This assures that the electrical loading on the linear section generates an electrical field in the direction of the polarization and prevent de-polarization of the linear section.

Rise Time Considerations

Many applications require short rise times. Hence, in various exemplary embodiments of the invention the more demanding calculations are conducted in advance. This can be done by calculating the vector $u_3$ and determining the polarization and de-polarization voltages, $V^{pol}$ and $V^{depol}$ prior to the actual operation of the actuator device of the present embodiments. During operation, the required operations needed in order to determine the voltage distribution among the layers are: searching the vector $u_3$ for $u_3^k$; determination of $N_p$; and the evaluation of $V_{linear}$ via EQ. (5). These operations do not require a significant computational effort. This advantage contributes to the simplicity of the operation in spite of the work in the complex nonlinear range and to applicability of the present embodiments to applications with short rise time.

Example 2

Numerical Study

In the present example, the method described in Example 1 was employed to study the operation of an actuator device according to some embodiments of the present invention. The properties and components of the actuator device studied in this example are summarized in Table 1, below:

TABLE 1

| Property | Symbol | Value | |
|---|---|---|---|
| Number of individually controlled active layers | $N_a$ | 400 | |
| Number of layers in the linear part | $N_{Lin}$ | 3 | |
| Depoled layer thickness | l | 0.25 | [mm] |
| Radius of the actuator | R | 20 | [mm] |
| Radius of the rubber pre-stressing element | r | 2.167 | [mm] |
| Elastic modulus of an active layer at working point 1 | $[C_{3333}]_1$ | 34 | [GPa] |
| Elastic modulus of an active layer at working point 2 | $[C_{3333}]_2$ | 34 | [GPa] |
| Axial piezoelectric constant of the linear segment | $d_{333}$ | $-1.049 * 10^{-6}$ | [mm/V] |
| Layer thickness change when switching from point 1 to 2 | $\Delta u_{1 \to 2}$ | $5.3996E * 10^{-4}$ | [mm] |
| Pre-stressing element's elastic modulus | $E_{ps}$ | 2800 | [MPa] |
| Prestressing force | $\overline{A}_{33}^0$ | 19872 | [N] |
| Prestressing stress | $\overline{A}_{33}^0/\pi r^2$ | 16 | [MPa] |
| Spring Constant of the pre-stressing element | $K_p = \dfrac{\pi r^2 E_{ps}}{(N_a + N_{Lin})l}$ | 410 | [N/mm] |

The initial state of the active layers is the depoled domain state. The linear part of the actuator (layers 36, see FIG. 2A) consists of three fully polarized active layers. $\Delta u_{1 \to 2}$, $V^{pol}$, and $V^{depol}$ were determined using the model described in Annex A. The micromechanical constitutive models of Hwang et al [Hwang et al (1998) and Kushnir and Rabinovitch (2007) supra. were used for determining $[C_{3333}]_1$, $[C_{3333}]_2$, and $d_{333}$. The maximal displacement range of the actuator was approximately 0.35 mm. For comparison, the displacement range of a conventional linear actuator of the same geometry and material that is limited to the linear piezoelectric range is 0.08 mm, which is 4.375 times smaller.

In this example, no voltage was applied in the initial state of the actuator device. The voltage distribution required to achieve a displacement of 0.15 mm was calculated first. Next, the complementary voltage distribution required to reduce the displacement from 0.15 mm to 0.10 mm was calculated. The solution of the shape control problem was then checked and verified by calculating the displacement distribution along the stack using the model described in Annex A.

Operation Against a "Dead Weight"

In this example, the operation of the actuator device of the present embodiments was studied for the case of an external compressive force of F=−1000N. The prestress force under zero displacement and with the prestressing element 32 in contact with the edge plates but not in contact with the layers is $\overline{A}_{33}^0$=−19872N. Hence, the axial force (in Newtons) at the actuator edge is given by:

$$\overline{A}_{33}(u_3) = \overline{A}_{33}^0 + F - K_p \cdot u_3 = -20872 - 410 u_3, \quad (EQ. 7)$$

where $K_p$ is the stiffness of the prestressing device (see Table 1). The maximal displacement range of the actuator is approximately 0.35 mm. Hence, the maximal axial force at the actuator edge is approximately −21015 N. Under these conditions, a polarization voltage of $V^{pol}$=675 V is sufficient to fully polarize the active layers. The lower bound of the axial force at the actuator edge is −20872 N. A depolarization voltage, $V^{depol}$=−50 V brings the active layers to the lowest possible level of polarization under this level of force.

Figure 5A:
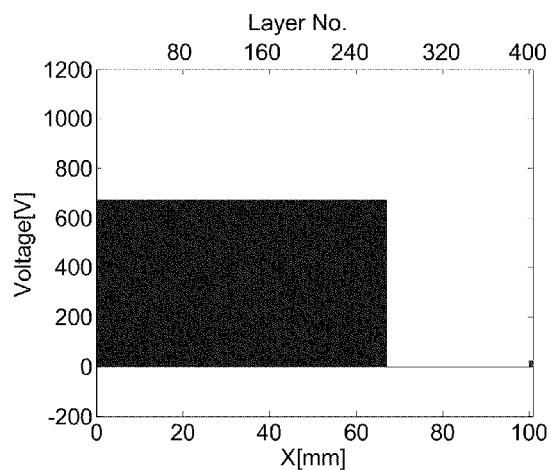
Figure 5B:
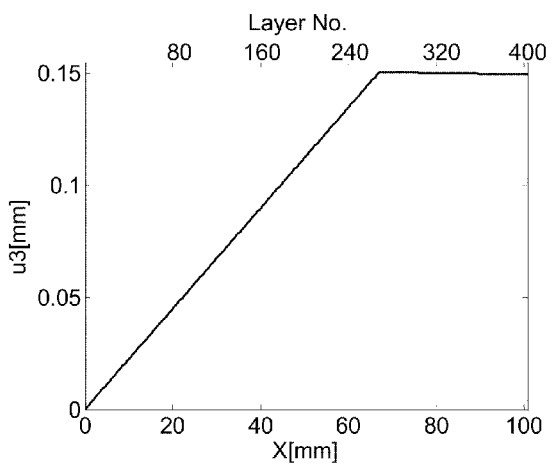

The method described in Example 1 was executed so as to assign working points to the layers for generating an overall displacement of the actuator tip from zero to 0.15 mm. The method assigned a polarized domain state (working point 2) to 268 layers and a depoled domain state to all other layers. Hence, a temporary voltage of 675 V is applied to the first 268 layers and then released back to zero. The overall displacement resulting from the application of temporary voltage is 0.14057 mm. The voltage distribution along the stack is shown in FIG. 5A.

The method described in Example 1 was further executed so as to calculate the voltage which induces a linear inverse piezoelectric effect in layers 36. According to the calculation scheme described in Example 1, the final displacement can be obtained by applying a voltage of $V_{linear}$=26.303V to layers 36. Unlike the polarizing voltage that induces the nonlinear effect which is applied momentarily, the voltage which induces the linear effect is maintained continuously as long as the displacement is required. The accurate displacement distribution corresponding to this electrical loading scenario is presented in FIG. 5B. As shown, the achieved displacement is 0.14964 mm.

If desired, a displacement correction procedure can be employed. This correction can be achieved by increasing the linear voltage $V_{linear}$=141.166V which results in a further displacement of 0.36 μm (about 0.24% of the desired displacement). This deviation from the predicted results occurs since the axial force is the initial prestress force, which is not sufficient to fully depolarize the material. The additional axial force (i.e., the external axial force and the additional prestress) induces a small amount of additional switching. The actual (negative) displacement of the depolarized layers is slightly larger than the predicted displacement. This small deviation is compensated by a correction to the linear voltage. If desired, this can be achieved by a closed loop control, which is preferably applied to the linear part of the actuator device.

The following procedure was employed to determine an operation scheme for generating an overall displacement of the actuator tip from 0.15 mm to 0.1 mm.

Figure 5C:
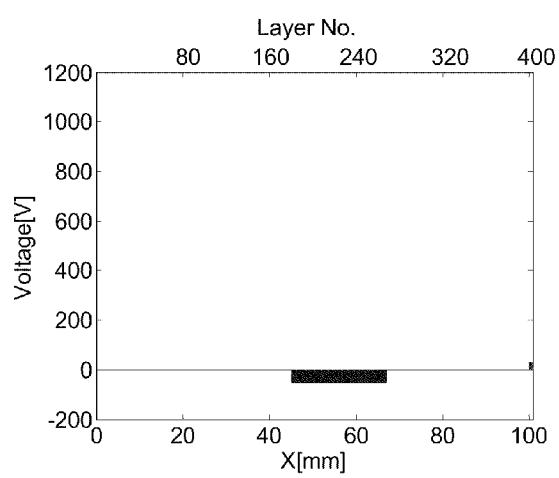
Figure 5D:
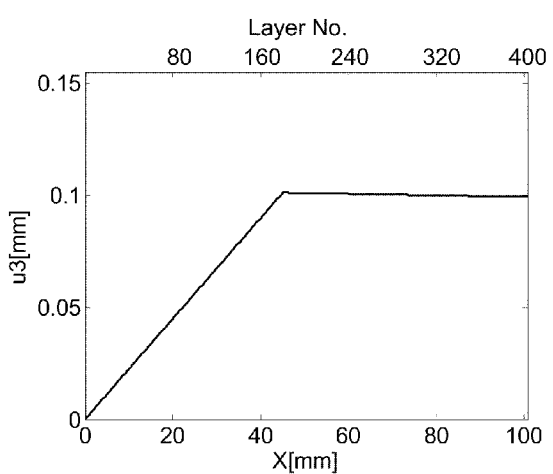

The method described in Example 1 was executed so as to assign working points to the layers for generating an overall displacement of 0.1 mm. The method assigned a polarized domain state (working point 2) to 180 layers and a depoled domain state to all other layers. Since a displacement of 0.15 mm was achieved by switching layers 1 to 268 to their polarized domain state, motion of the tip from 0.15 mm to 0.1 mm can be achieved by switching 87 of those layers to their depoled state. This can be done by a reveres bias of $V^{depol}$=−50V. The voltage distribution along the stack is shown in FIG. 5C. As shown the reverse bias is applied to layers 181 to 268.

A voltage level $V_{linear}$=29.2987V is applied to the linear section. The displacement distribution corresponding to this additional distribution of voltages is presented in FIG. 5D. The computed results show that in order to achieve the exact displacement and to compensate for the 0.67% discrepancy (attributed to the imperfect depoling of the layers), the closed loop linear control procedure increases the voltage applied to the linear section to $V_{linear}$=214.347V.

Operation Against a Linear Spring

In this example, the operation of the actuator device of the present embodiments was studied for the case of external load generated by a liner spring. The liner spring can represent the stiffness of non-active structural components adjacent to the actuator device. A spring constant, $K_{ext}$, of 1000 N/mm was considered. Hence, the axial force at the actuator edge is given by:

$$\overline{A}_{33}(u_3)=\overline{A}_{33}^0-(K_p+K_{ext})u_3=-19872-1410u_3 \qquad (\text{EQ. 8})$$

Figure 6A:
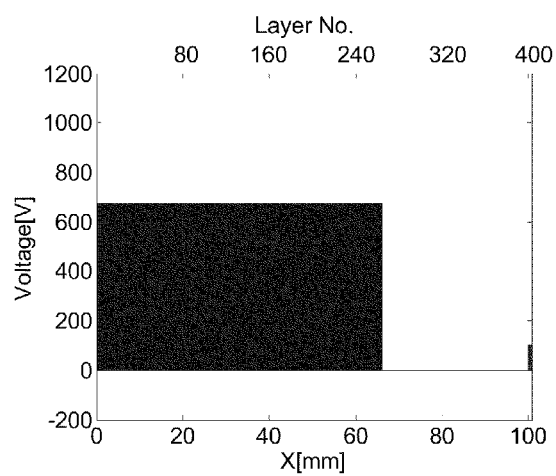
Figure 6B:
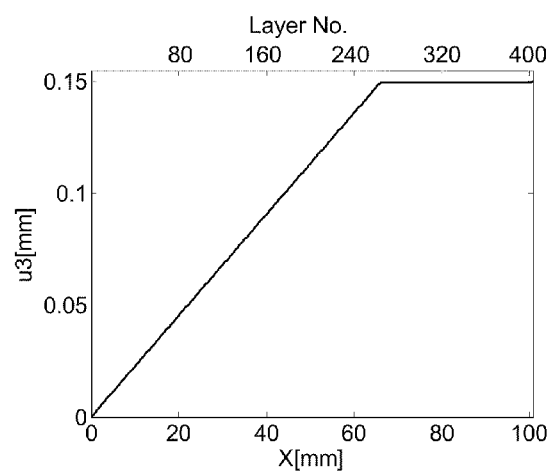

The distribution of the applied voltages required to move from zero to tip displacement of 0.15 mm is shown in FIG. 6A. In this case, 264 layers are polarized in order to achieve the desired displacement. The calculated voltage for biasing the linear section is $V_{linear}$=105.228 V. The displacement distribution corresponding to this actuation scheme is shown in FIG. 6B. The calculated tip displacement in this case is 0.1499 mm.

If desired, a linear closed loop control procedure can be employed to increase the linear voltage to $V_{linear}$=135.822 V in order to compensate for the 0.06% discrepancy.

Figure 6C:
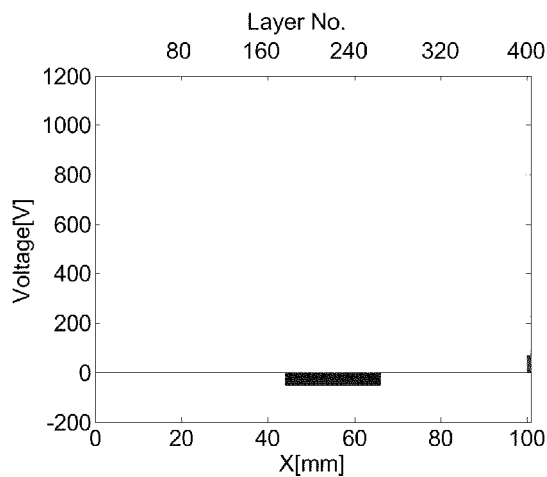
Figure 6D:
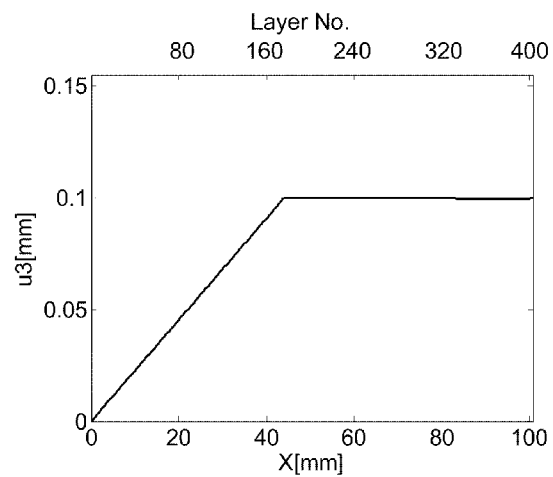

The following procedure was employed to determine an operation scheme for generating an overall displacement of the actuator tip from 0.15 mm to 0.1 mm, with reference to FIG. 6C.

The method described in Example 1 was executed so as to assign working points to the layers for generating an overall displacement of 0.1 mm. Layers 177 to 264 are depolarized and a linear voltage of $V_{linear}$=70.152V is applied to the three layers in the linear section. The displacement distribution corresponding to this additional distribution of voltages is presented in FIG. 6D and the calculated tip displacement is 0.099936 mm. In case the 0.064% discrepancy needs to be corrected using a closed loop linear control procedure, the linear voltage is corrected to $V_{linear}$=90.548V.

Annex A

Characterization of Nonlinear Ferroelectric Effect

In this annex, the nonlinear behavior of a piezoelectric-ferroelectric actuator according to various exemplary embodiments of the present invention is analytically characterized.

A nonlinear analytical electromechanical model of a one-dimensional (1-D) piezoelectric-ferroelectric actuator operated in the nonlinear regime is developed. This type of 1-D model can represent, for example, a piezoelectric rod actuator, a fiber in a Macro Fiber Composite (MFC) actuator, or a layer within a stack actuator. The analytical model uses a variational principle for the derivation of the equilibrium equations and boundary conditions, which are formulated in terms of stress and electric displacements resultants. The constitutive model takes into account the domain switching phenomena and the coupling of the mechanical and electrical behavior. An iterative procedure for the solution of the nonlinear implicit governing equations is then developed. The capabilities of the model and the potential advantages of extending the operational range of the actuator into the nonlinear regime are examined numerically.

Mathematical Formulation

The formulation of the analytical model for the nonlinear actuator includes the variational principle, the field equations, the boundary conditions, and the constitutive model. The governing equations, which take the form of a set of nonlinear first order differential equations, are then formulated. The solution procedure is discussed thereafter.

Assuming mechanically and electrically quasi-static conditions, the principle of virtual work for a ferro-electro-elastic continuum in the LaGrangian description is:

$$-\oint_{S^0}\overline{\sigma}^0\delta\phi dS^0 + \oint_{S^0} t^0\cdot\delta u dS^0 + \qquad (\text{EQ. A1})$$
$$\int_{V^0} b^0\cdot\delta u\, dV^0 + \int_{V^0} m^0\cdot\delta\omega\, dV^0 =$$
$$\int_{V^0} D^0\cdot\delta\phi(\overline{\nabla})_x\, dV^0 + \frac{1}{2}\int_{V^0}[\tilde{T}+\tilde{T}^T]:\delta e\, dV^0$$

where $S^0$ is the un-deformed surface containing the un-deformed volume $V^0$, $\overline{\sigma}^0$ is the charge density per unit of un-deformed area, $\phi$ is the electric potential, $t^0$ is the pseudo traction vector (which includes mechanical tractions and electrical forces on surface charges), u is the displacement field, $b^0$ is the referential body force vector which includes mechanical body forces and electrically induced body force, $m^0$ is the referential body moment, ω is the rotation angle, $D^0$ is the referential electric displacement, $\phi \bar{\nabla}_X$ is the gradient of the electrical potential, $\tilde{T}$ is the second Piolla-Krichhoff stress tensor, e is the LaGrangian strain tensor, δ is the variational operator, and ( ):( ) denotes the scalar product of two second rank tensors.

The body force and the electrical body moment are given by:

$$b^0 = (\tilde{E} \cdot F^{-1}) \bar{\nabla}_X \cdot P^0 + q \quad \text{(EQ. A.2)}$$

$$m^0 = F \cdot P^0 \times \tilde{E} \cdot F^{-1} \quad \text{(EQ. A.3)}$$

where $\nabla_X$ is the referential Nabla vector, F is the deformation gradient, $\tilde{E} = E \cdot F$ is the referential electrical field, $(\,)\bar{\nabla}_X$ is the referential gradient, $P^0 = JF^{-1} \cdot P$ is the referential polarization, J is the determinant of the deformation gradient, P is the polarization, and q is any distribution of applied body forces (including gravitational body forces). Eqs. (A.2) and (A.3), which include the mechanical and the electrical components introduce the polarization into the principle of virtual work, Eq. (A.1).

The kinematical relations are given by:

$$e = \frac{1}{2}[F^T \cdot F - I] \quad \text{(EQ. A.4)}$$

$$\omega = \frac{1}{2}\nabla_x \times u \quad \text{(EQ. A.5)}$$

$$\tilde{E} = -\phi \bar{\nabla}_x \quad \text{(EQ. A.6)}$$

and the deformation gradient satisfies:

$$F = I + u\bar{\nabla}_X \quad \text{(EQ. A.7)}$$

By using Eqs. (A.4-A.7), Eq. (A.1) becomes a function of two variables: u and φ. Correspondingly, the principle of virtual work (Eq. (A.1)) yields the following two field equations (also see Toupin (1956)):

$$\nabla_X \cdot D^0 = 0 \text{ in } V^0 \quad \text{(EQ. A.8)}$$

$$\nabla_X \cdot (\tilde{T} \cdot F^T) + (\tilde{E} \cdot F^{-1})\bar{\nabla}_X \cdot P^0 + q = 0 \text{ in } V^0 \quad \text{(EQ. A.9)}$$

In the absence of body moments, the two differential field equations, Eq. (A.8) and (A.9), which correspond to the variational terms u and, are sufficient. However, the existence of body moments requires another algebraic equation that reads:

$$(\tilde{T} - \tilde{T}^T) + [(P^0 \otimes \tilde{E}) \cdot F^{-1} \cdot F^{-T}] - [P^0 \otimes \tilde{E} \cdot F^{-1} \cdot F^{-T}]^T = 0 \text{ in } V^0 \quad \text{(EQ. A.10)}$$

where ⊗ is the dyadic product.

The boundary conditions take the following form:

$$(\bar{\sigma}^0 D^0 \cdot N) = 0 \text{ or } \phi = \bar{\phi} \text{ on } S^0 \quad \text{(EQ. A.11)}$$

$$[t^0 - N \cdot (\tilde{T} \cdot F^T)] = 0 \text{ or } u = \bar{u} \text{ on } S^0 \quad \text{(EQ. A.12)}$$

where $\bar{\phi}$ and $\bar{u}$ are prescribed potential and displacement field, respectively, defined in the reference configuration and N is the outward unit normal to the surface $S^0$.

In the present example, the general 3-D theory is reduced to the 1-D case of the piezoelectric-ferroelectric body shown in FIGS. 7A-E. This body can represent a rod actuator, a segment in an active fiber within a Macro Fiber Composite (MFC) actuator, or a layer in a multi-layer stack actuator. In the last case, the dimensions of the cross-section are usually larger than the length (thickness) of the layer. However, the mechanical and especially the electrical boundary conditions yield a 1-D type of response through the depth of the layer. In the case of a fiber within an MFC actuator, the voltage, which is applied through interdigitated electrodes (IDEs), yields a complex electric field pattern in the close vicinity of the electrodes. However, at a short distance away from the electrodes, the response of the fiber becomes a unidirectional one. Hence, the geometry shown in FIG. 7 can represent a segment of the active fiber between two IDEs. For clarity of the drawing, the notation and the sign conventions, which are also given in FIG. 7, refer to the case of a rod. However, they are equally applicable to the case of a layer in a stack (see FIG. 8 for example) and they can be applied to a segment of a fiber in an MFC actuator. In that case, L stands for the spacing between the IDEs.

In all cases studied in the present example, the polarization and the electrical field are in the axial ($x_3$) direction. Therefore, body moments do not exist. It is also anticipated that the ferroelectric materials under consideration develop strains that do not exceed 10%. Hence, it is sufficient to treat the case of small strains and large rotations. Since the longitudinal actuation scheme does not involve rotations, the formulation reduces to the geometrically linear case. Finally, in the present example the effect of the electrically induced body forces is not considered. These simplifying assumptions and the consideration of the 1-D problem yield:

$$m^0 = 0 \quad \text{(EQ. A.13)}$$

$$e = e_{33} = u_{3,3} \quad \text{(EQ. A.14)}$$

$$(\tilde{E} \cdot F^{-1})\bar{\nabla}_x \cdot P^0 = 0 \quad \text{(EQ. A.15)}$$

Thus, the variational principle of virtual work reduces to:

$$-\oint_{S^0} \bar{\sigma}^0 \delta\varphi \, dS^0 + \oint_{S^0} t_3^0 \delta u_3 \, dS^0 + \int_{V^0} q_3 \delta u_3 \, dV^0 = \quad \text{(EQ. A.16)}$$

$$\int_{V^0} D_3^0 \delta\varphi_3 \, dV^0 + \int_{V^0} \tilde{T}_{33} \delta e_{33} \, dV^0$$

The 1-D variational principle, Eq. (A.16), yields the following field equations:

$$\hat{D}_{3,3} = 0 \quad \text{(EQ. A.17)}$$

$$\hat{N}_{33,3} + \bar{\lambda}_3 = 0 \quad \text{(EQ. A.18)}$$

and the boundary conditions:

$$\alpha\hat{D}_3 + \bar{Q} = 0 \text{ or } \phi = \bar{\phi} \text{ at } x_3 = 0, L \quad \text{(EQ. A.19)}$$

$$\alpha\hat{N}_{33} - \bar{\lambda}_{33} = 0 \text{ or } u_3 = \bar{u}_3 \text{ at } x_3 = 0, L \quad \text{(EQ. A.20)}$$

where $$\hat{D}_3 = \int_A D_3^0 \, dA$$

is the electrical displacement resultant, $$\hat{N}_{33} = \int_A \tilde{T}_{33} \, dA$$

is the axial force resultant, $$\bar{\lambda}_3 = \int_A q_3 \, dA$$

is the applied axial body force resultant, $$\overline{Q} = \int_A \sigma^0 \, dA$$

is a prescribed charge on the electrode, $$\overline{\Lambda}_{33} = \int_A t_3^0 \, dA$$

is the prescribed concentrated axial force at the edges, $\alpha=-1$ at $x=0$ $\alpha=1$ at $x=L$, and A is the cross-section area (see FIG. 7).

Assuming that all quantities are uniformly distributed through the cross section, the integration over the cross section reduces to $$\int_A [\,] \, dA = [\,] A.$$

Thus, for example, $\hat{N}_{33} = \tilde{T}_{33} A$ etc.

Along with the field equations and the boundary conditions, the analysis of the behavior of the actuator in the non-linear range requires a constitutive model that takes into account the switching phenomenon. In the present example, the micromechanical approach of Kushnir and Rabinovitch (2007) is adopted.

The constitutive relations for the ferroelectric material read:

$$D^0 = JF^{-1} \cdot p^s + \kappa \cdot \tilde{E} + d : \tilde{T} \quad e = e^s + d^T \cdot \tilde{E} + C^{-1} : \tilde{T} \qquad \text{(EQS. A.21a,b)}$$

where $p^s$ is the remanent polarization vector (in the current configuration), $e^s$ is the remanent part of the strain tensor, $\kappa$ is the dielectric permittivity tensor, d is the piezoelectricity tensor, and C is the elastic tensor. The domain state and the corresponding material properties are determined according to the domain switching law of Hwang et al (1998) and Kushnir and Rabinovitch (2007). Focusing on the uni-axial (1-D) and geometrically linear case, and assuming that the mechanical properties as well as the stress and displacement fields are uniform through the cross-section (i.e. independent of $x_1, x_2$), the constitutive equations are written in terms of the resultants as follows:

$$\hat{D}_3 = \hat{p}_3^s + \kappa_{33} A \tilde{E}_3 + d_{333} \hat{N}_{33} \qquad \text{(EQS. A.22a,b)}$$

$$e_{33} = e_{33}^s + d_{333} \tilde{E}_3 + C_{3333}^{-1} \frac{\hat{N}_{33}}{A}$$

where $$\hat{p}_3^s = \int_A p_3^s \, dA = p_3^s A$$

is the resultant of the remanent polarization. Eq. (A.22a) can be rewritten in the following form:

$$-\tilde{E}_3 = \frac{1}{\kappa_{33} A} \left[ \hat{p}_3^s - \hat{D}_3 + d_{333} \hat{N}_{33} \right] \qquad \text{(EQ. A.23)}$$

The second Maxwell equation for the 1-D case is:

$$-\tilde{E}_3 = \phi_{,3} \qquad \text{(EQ. A.24)}$$

Thus, substituting Eq. (A.24) into Eq. (A.23) yields:

$$\phi_{,3} = \frac{1}{\kappa_{33} A} \left[ \hat{p}_3^s - \hat{D}_3 + d_{333} \hat{N}_{33} \right] \qquad \text{(EQ. A.25)}$$

Introducing the kinematic relation, Eq. (A.14), and Eq. (A.23) into Eq. (A.22b) yields:

$$u_{3,3} = e_{33}^s - \frac{d_{333}}{\kappa_{33} A} \left[ \hat{p}_3^s - \hat{D}_3 + d_{333} \hat{N}_{33} \right] + C_{3333}^{-1} \frac{\hat{N}_{33}}{A} \qquad \text{(EQ. A.26)}$$

Eqs. (A.17), (A.18), (A.25) and (A.26), along with the boundary conditions, Eqs. (A.19) and (EQ. A.20), define the 1-D boundary value problem of the piezoelectric-ferroelectric element. The four governing equations are stated in terms of $u_3$, $\hat{N}_3$, $\hat{D}_3$, and $\phi_3$. Suitable procedure for the solution of this boundary value problem will now be outlined.

Solution Procedure

The constitutive equations (A.21a, A.21b) do not define a unique relation. The remanent polarization and strain, as well as the material properties are governed by the domain state, which depends on the loading history. In addition, the dependency of the remanent polarization, the remanent strain, and the material constants on the unknowns $u_3$, $\hat{N}_3$, $\hat{D}_3$, and $\phi_3$ is an implicit one. In order to overcome these two obstacles, the problem is solved using an iterative scheme and a step-by-step type of solution with a pseudo-time coordinate, $\tilde{t}$. $\tilde{t}$ is termed "a pseudo time coordinate" since the formulation does not take phenomena such as inertia forces, electro-magnetic induction, and switching rate into account. The solution procedure is as follows:

(1) The electrical and/or mechanical loads are defined in terms of the pseudo-time coordinate. Thus, the prescribed values at the boundaries are given by:

$$\overline{Q} = \overline{Q}(\tilde{t}) \text{ or } \overline{\phi} = \overline{\phi}(\tilde{t}) \text{ at } x_3 = 0, L \qquad \text{(EQ. A.27)}$$

$$\overline{\Lambda}_{33} = \overline{\Lambda}_{33}(\tilde{t}) \text{ or } \overline{u}_3 = \overline{u}_3(\tilde{t}) \text{ at } x_3 = 0, L \qquad \text{(EQ. A.28)}$$

and the distributed external mechanical load is given by $$\overline{\lambda}_3 = \overline{\lambda}_3(\tilde{t}) \qquad \text{(EQ. A.29)}$$

(2) The time coordinate is divided into time steps $\tilde{t}_i$ ($i=1, 2, \ldots, N$). Hence, Equations (A.27)-(A.29) become:

$$\overline{Q} = \overline{Q}(\tilde{t}_i) \text{ or } \overline{\phi} = \overline{\phi}(\tilde{t}_i) \text{ at } x_3 = 0, L \qquad \text{(EQ. A.30)}$$

$$\overline{\Lambda}_{33} = \overline{\Lambda}_{33}(\tilde{t}_i) \text{ or } \overline{u}_3 = \overline{u}_3(\tilde{t}_i) \text{ at } x_3 = 0, L \qquad \text{(EQ. A.31)}$$

$$\overline{\lambda}_3 = \overline{\lambda}_3(\tilde{t}_i) \qquad \text{(EQ. A.32)}$$

(3) At $\tilde{t}_0$ (t=0 in the present example) the material is polarized to its saturation value in the axial direction. In this case, the initial domain state and the corresponding material properties, remanent strain, and remanent polarization, $d_{333}$, $C_{3333}$, $\kappa_{33}$, $p_3^s$ and $e_{33}^s$, are known.

(4) At the following time step (i.e. $\tilde{t}_1$ in case of the first time step or $\tilde{t}_i$ in case of the i'th step) the material properties that correspond to the domain state determined in the previous time step ($\tilde{t}_{i-1}$) (in the case of the first iteration within the i'th time step), or in the previous iteration (see (5) below) are introduced to Eqs. (A.17), (A.18), (A.25) and (A.26). This yields a set of four ordinary linear differential equations with variable coefficient. These equations, along with the boundary and continuity conditions, are solved for the unknowns $u_3$, $\hat{N}_3$, $\hat{D}_3$, and $\phi_3$. In the numerical study presented here, the equations and the boundary conditions are solved using the BVP package available in Matlab® software.

(5) The solution obtained in (4) is used to re-determine the domain state and the material properties. This is achieved by means of the micromechanical model of Hwang et al (1998) and Kushnir and Rabinovitch (2007). This constitutive model yields new values of material properties ($d_{333}$, $C_{3333}$, $\kappa_{33}$) and remanent strain and polarization ($e_{33}^s$, $p_3^s$) and a new domain state. If the new values differ from the ones used in step 4, convergence is not achieved and the algorithm returns to step 4 with the updated (new) properties and values obtained in step 5. If the normalized difference between the values obtained in step 5 and the ones used in step 4 is sufficiently small, convergence is achieved. In that case, the unknowns determined in step 4 define the solution that corresponds to the load level at $\tilde{t}=t_i$ and the algorithm proceeds to the next pseudo time step (namely (4) with i=i+1).

Numerical Study

Following is a numerical study examines the structural response of the PLZT 8/65/35 layer shown in FIG. 8A-B. This layer represents a component of a multi-layer stack actuator and it is subjected to various electromechanical load systems. The material properties of PLZT 8/65/35 are reported by Hwang et al (1998) and summarized in Table 2, below.

TABLE 2

| Material constant and symbol | Value |
| --- | --- |
| Piezoelectric coef. $d_{333}$ | $2.376 \cdot 10^{-9}$ [m/V] |
| Piezoelectric coef. $d_{311}$, $d_{322}$ | $1.138 \cdot 10^{-9}$ [m/V] |
| Dielectric permittivity $\kappa$ | $56.25 \cdot 10^{-9}$ [F/m] |
| Elastic modulus Y | $3.4 \cdot 10^{10}$ [Pa] |
| Poisson ratio $\mu$ | 0.3 |
| Spontaneous polarization $P_0$ | 0.3 [C/m$^2$] |
| Spontaneous strain $e_3$ | 0.0028 |
| Spontaneous strain $e_1$ | −0.0014 |
| $\overline{E}_0$ for 90° switching | 0.13 [MV/m] |
| $\overline{E}_0$ for 180° switching | 1.0 [MV/m] |
| The weighting factor $\psi$ | 1.4 |
| $\overline{Y}$ | $0.75 \cdot 10^{10}$ [Pa] |
| $\overline{\epsilon}$ | $0.8 \cdot 10^{-6}$ [F/m] |

At the initial (zero strain) state, the layer is fully and positively polarized in the $x_3$ direction (i.e., the spontaneous polarization equals the saturation polarization). The electrodes are located at x=0 and x=L. In all cases, the layer is subjected to a sinusoidal electrical potential difference given by $V=\overline{\phi}(L)-\overline{\phi}(0)=1.5\sin(2\pi t)$ [kV] where t is the pseudo time coordinate. In the second example, the response of the layer to a biased sinusoidal electrical potential difference combined with a mechanical load is also studied. For comparison, results obtained using the non-linear theory are compared with the prediction of the linear theory and with the response to a low-level electric load $V=0.25\sin(2\pi t)$ [kV]. This load, which is 6 times lower than the full load, is supposed to be within the linear range. Yet, the response to the low-level electrical load is obtained using the nonlinear model. The objective of the comparison of the nonlinear results to the linear ones is to demonstrate the enhancement of the actuator capabilities when operated in the nonlinear range. Hence, its significance is in highlighting the potential of the nonlinear regime and its unique characteristics.

The following numerical study examines 4 cases. In a first case, the actuator is subjected to electrical actuation only. In a second case, two types of the electrical actuation (biased and nonbiased) are combined with a mechanical load at the free edge ($x_3$=L). In a third next case, the actuator is electrically loaded against a linear spring. In a fourth case combines the electrical load with a uniformly distributed mechanical load.

Case 1

Electrical Actuation

The first numerical example studies the active layer shown in FIGS. 8A-B, with $\overline{\lambda}_3$=0 and $\overline{\Lambda}_{33}$=0 (i.e. electrical load only). The non-linear response of the actuator, the response to the high-level electrical load (±1.5 [kV]) predicted by the linear theory, and the response to the low-level electrical load within the linear range (±0.25 [kV]) predicted by the nonlinear theory appear in FIGS. 9A-D. FIGS. 9A and 9B show that the displacement range observed under voltage applied in the nonlinear regime is about 4 times larger than the displacements under a voltage difference in the linear operational range. This is a notable improvement of the actuation capabilities. FIGS. 9A-D also show that the prediction of the linear theory is fundamentally different from the actual nonlinear response. At some instances, the linear theory fails to predict the magnitude and the sign of the response. It should be noted, however, that the linear range of operation can be extended by applying a biased potential difference in the range where the prediction of the linear theory and the nonlinear response coincide.

FIGS. 9C and 9D show that the nonlinear response in terms of the electric displacement is also fundamentally different from the prediction of the linear theory for the nonlinear range and from the actual response to voltages in the linear range. The results also reveal the discontinuities associated with the domain switching. This effect gives rise to the enhanced strain actuation in the non-linear range and to the ability to generate significantly larger displacements.

Under the given electromechanical external loads, the stress and the electrical field are uniform along the $x_3$ axis. Hence, the end displacement response is expected to be qualitatively similar to the strain response of the stress free case experimentally characterized by Lynch (1996). In the same manner, the electric displacement response is expected to be similar to the electric displacement response at the stress free case given by Lynch (1996). The nonlinear response determined by the model developed here and shown in FIGS. 9B and 9D, reveals such qualitative agreement with the experimental results of Lynch (1996). The results are also in qualitative agreement with the experimental results reported by Chaplya et al (2001). These observations contribute to the verification of the structural model.

Case 2

Electrical Actuation and Mechanical Load

In the second case, the active layer is subjected to electrical actuation and to a concentrated compressive load $\overline{\Lambda}_{33}$=−30 [kN] at $x_3$=L. (Body forces are not applied). The response of the actuator to the mechanical load and a nonbiased sinusoidal potential difference $V=\overline{\phi}(L)-\overline{\phi}(0)=0.25\sin(2\pi t)$ [kV] is studied in FIGS. 9A-D. In this case, the compressive load tends to yield 90° switching and to depolarize the active layer. The high-level electrical field overcomes this effect and the nonlinear response yields notable displacements at the end of the layer. On the other hand, the voltage in the "linear range of operation" is not "strong" enough to re-polarize the piezoelectric material and it yields almost no displacement at the end of the actuator. The implication of this effect is that the operation of actuators against loads that are sufficiently high to mechanically depolarize the ferroelectric stack extend into the nonlinear range of operation.

FIGS. 9A-D shows that the prediction of the linear theory is fundamentally different from the actual nonlinear response. It is possible to achieve a linear response when applying an electrical potential in the range where the nonlinear response and the prediction of the linear theory coincide. However, this requires repolarization of the material. For example, the voltage can first be increased to 1.5 [kV]. Moreover, when operating the stack in this range, the displacement variation is about 4 times smaller than the one that can be achieved under operation in the full nonlinear range.

Alike the first case, the stress and electrical field are uniform along the $x_3$ axis. Thus, the end displacement response is qualitatively similar to the strain response measured by Lynch (1996). The electrical displacement response is in good agreement with the electrical displacement measured by Lynch (1996). The results are also qualitatively similar to the experimental results obtained by Chaplya et al (2001). These correlations further support the validity of the structural model developed here.

The response of the active layer to the mechanical load and a biased electrical potential difference $V=\bar{\phi}(L)-\bar{\phi}(0)=\{0.9\sin(2\pi t+\phi)+0.6\}$[kV] where $\phi$ is the phase angle satisfying $V(t=0)=0$ is studied in FIGS. 11A-B. The results that appear in FIG. 11A—Bare qualitatively similar to the experimental result obtained by Mitrovitch et al (2001) and Chaplya et al (2001) for PZT-5H actuators. This observation also contributes to the validity of the analytical model.

Case 3

Electrical Actuation Against a Linear Spring

In the third case, the active layer is operated against a linear spring located at $x_3=L$ ($\bar{\lambda}_3=0$). The spring represents a case where the actuator is operated against an adjacent passive structural component, or against external tractions that depend on the level of deformation (e.g. Rabinovitch and Vinson (2003)). Due to the presence of the spring, the mechanical boundary condition, Eq. (20), at $x_3=L$ is replaced with:

$$\hat{N}_{33}+K\cdot u_{33}=0 \quad\quad (EQ. A.21)$$

where K is the spring constant. In this case, K=30·10⁶ [kN/m]. The response of the actuator is studied in FIGS. 12A-B. Opposed to the case of a constant compressive load (case 2) the spring yields stresses that tend to decay both the positive and the negative displacements. Hence, the displacement variation observed in this example is about 3 times smaller than the ones observed in the first and second cases. Furthermore, since the initial load-free state is the fully positively polarized state of the material, the response is non-symmetric as seen in FIGS. 12A-B.

FIGS. 12A-B show that also here the displacement range under voltages applied in the nonlinear range is about 4 times larger than the range of displacement under a voltage difference in the linear operational range. Hence, the operation in the nonlinear range yields an improvement of the actuation capabilities. Once more, a linear response can be obtained when applying an electrical potential in the range where the nonlinear response and the prediction of the linear theory coincide. In this case, it is possible to achieve a displacement variation, which is about three quarters of the one obtained when operating in the full nonlinear range.

Case 4

Electrical Actuation with Uniformly Distributed Mechanical Load

In the fourth case, the electrical load is combined with a uniformly distributed mechanical load $\bar{\lambda}_3=-30$ [MN/m] ($\bar{\lambda}_{33}=0$). The response of the active layer is shown in FIGS. 13A-B. In this case, the mechanical stress varies along the $x_3$ axis. This effect leads to some interesting phenomena. For example, actuation in the assumed linear range (±0.25 [kV]) yields a severe nonlinear response. In this case, a linear response is only possible in the range for which the prediction of the linear theory and the nonlinear response coincide (0-1.5 [kV]). Yet, the displacement variation in this limited range is about 5 times smaller than the one observed under operation in the full nonlinear range. These phenomena are attributed to the formation of regions where the compressive stress is not "strong enough" to fully de-polarize the material. In these regions, even a weak electrical field is sufficient to induce switching and to yield strain. The variation of the compressive stress along the layer also results in a non-uniform electrical field distribution. This affects both the linear and the remanent parts of the response and contributes to the difference between the actual nonlinear response and the prediction of the linear theory.

FIGS. 14A-D show the distributions of the displacement, electrical field, remanent polarization, and electrical potential along the $x_3$ axis at t=2.5 [sec]. The changes in the remanent polarization in the nonlinear response shown in FIG. 14C result in the distribution of the electric potential shown in FIG. 14D. Although no potential difference between the electrodes is applied, the electric potential along the layer is as high as 360[V] at some points. On the other hand, the linear theory predicts an electric potential that is not higher than 60[V]. The corresponding electrical fields are shown in FIG. 14B. In the actual nonlinear response, the electrical field varies between -1.4 [MV/m] and 1.4 [MV/m] and changes rapidly around mid-span. The liner theory predicts a linear variation of the electrical field between -0.25 [MV/m] and 0.25 [MV/m]. The changes in the domain state along the active layer are accompanied by a distribution of remanent strain. The high levels of electrical field also results in strain (due to the piezoelectric effect) and contribute to the differences observed in the displacement response in FIG. 14A.

REFERENCES

Chaplya, P. M. and Carman G. P. (2001), "Dielectric and piezoelectric response of lead zirconate-lead titanate at high electric and mechanical loads in terms of non-180 degrees domain wall motion" *Journal of Applied Physiscs* 90 (10): 5278-5286.

Hwang, S. C., Huber, J. E., McMeeking, R. M., and Fleck, N. A. (1998), "The simulation of switching in polycrystalline ferroelectric ceramics", *Journal of Applied Physics* 84(3): 1530-1540.

Kushnir U. and Rabinovitch O. (2007) "Grain orientation scattering in nonlinear constitutive modeling of piezoelectric-ferroelectric materials", *Journal of Intelligent Material Systems and Structures* 18(11): 1149-1163.

Lynch, C. S. (1996), "The effect of uniaxial stress on the electro-mechanical response of 8/65/35 PLZT", *Acta Materialia* 44(10):4137-4148.

Mitrovic, M. Carman, G. P. and Straub F. K. (2001), "Response of piezoelectric stack actuators under combined electro-mechanical loading", *International Journal of Solids and Structures* 38(24-25):4357-4374.

Rabinovitch, O. and Vinson, J. R. (2003), "On the design of piezoelectric smart fins for flight vehicles", *Smart Materials and structures* 12(5):686-695.

Toupin R. A. (1956), The Elastic Dielectric. *Journal of Rational Mechanical Analysis* 5(6), 849-915.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. An actuator device, comprising:
   a stack of piezoelectric-ferroelectric active layers separated by surface electrodes, wherein at least a few of said surface electrodes are independently addressable such that at least two active layers are biasable by different voltages; and
   a voltage source and controller being in electrical communication with said at least few surface electrodes and configured to generate said voltages, wherein said voltages induce a nonlinear ferroelectric effect on at least one of said layers.

2. A method, comprising applying at least two different voltages to an actuator device which comprises a stack of piezoelectric-ferroelectric active layers separated by surface electrodes, such that said at least two voltages respectively bias at least two different active layers, and induce a nonlinear ferroelectric effect on at least one of said layers.

3. The method according to claim 1, wherein said voltages inducing said nonlinear ferroelectric effect are applied momentarily.

4. The device according to claim 1, wherein at least one layer is applied by a voltage inducing a nonlinear ferroelectric effect in said layer, and at least one layer is applied by a voltage inducing a linear inverse piezoelectric effect in said layer.

5. The device according to claim 4, wherein said voltage inducing said nonlinear ferroelectric effect is applied momentarily, and said voltage inducing said linear inverse piezoelectric effect is applied continuously.

6. The device according to claim 4, wherein a number of layers applied by said voltage inducing said linear inverse piezoelectric effect is selected so as to compensate a minimal discontinuous displacement generated by said nonlinear ferroelectric effect.

7. The device according to claim 1, further comprising a loop control unit for controlling voltages applied to induce a linear inverse piezoelectric effect in response to displacements generated by a nonlinear ferroelectric effect.

8. The device according to claim 4, further comprising controlling voltages applied to induce said linear inverse piezoelectric effect according to displacements generated by said nonlinear ferroelectric effect.

9. The device according to claim 7, wherein said displacements are sensed by an external sensor configured to sense said displacements.

10. The device according to claim 7, wherein said displacements are sensed by at least one piezoelectric-ferroelectric layer which is part of the stack and which is not electrically biased during said sensing.

11. The device according to claim 1, wherein the actuator device further comprises a prestressing element positioned in physical contact with said layers and selected to apply mechanical stress on said layers.

12. The device according to claim 1, wherein said stack of piezoelectric-ferroelectric active layers is interposed between a top edge plate and a bottom edge plate, and wherein the actuator device further comprises a prestressing element positioned in physical contact with at least one of said edge plates and selected to apply mechanical stress on said plate.

13. The device according to claim 11, wherein said prestressing element is shaped as a bar introduced along a thickness direction of said stack through bores formed in said layers and said surface electrodes.

14. The device according to claim 11, wherein said prestressing element is made of a material which is elastic under a characteristic deformation range of said piezoelectric-ferroelectric layers.

15. The device according to claim 11, wherein said prestressing element is selected to apply on said layers a stress within a predetermined range of stresses defined between an upper bound and a lower bound, said upper bound corresponding to a polarized domain state of said layers and said lower bound corresponding to a depoled domain state of said layers.

16. The device according to claim 1, wherein said stack is electrically partitioned to a plurality of sub-stacks of piezoelectric-ferroelectric layers in a manner such that at least two sub-stacks are electrically decoupled, but for each sub-stack all surface electrodes of said sub-stack are electrically coupled.

17. The device according to claim 16, wherein at least a few sub-stacks have equal number of layers.

18. The device according to claim 16, wherein at least a few sub-stacks have different numbers of layers.

19. The device according to claim 16, wherein said plurality of sub-stacks comprises N sub-stacks each having a different number of layers which equals $2^k$, k being an integer satisfying $k \leq N$.

20. A system, comprising an actuatable device and the actuator device according to claim 1.

21. The system of claim 20, wherein said actuatable device comprises at least one of an optical alignment device, a pump injector, an interferometric dilatometer, a deformable mirror, a deformable optical grid, a microscope stage, a guide device, a cutting device, a valve, a VTR head, a swing CCD image sensor, a micro-angle adjusting device, a micro-angle adjusting device, an inkjet head, a dot-matrix printer head, a relay, an ultrasound generator, an aerodynamic steering wing, a rotor blade, a welding device, a suspension device, a vibration dumping system, a parallel robotic system, a hard disk drive head supporter arm, a nanofocusing Z-Drive, an optic fiber, and a switch.

22. The method of claim 2, wherein said at least two voltages comprise a first voltage and a second voltage and wherein said first voltage biases a single active layer.

23. A method, comprising applying to an actuator device voltage at sufficient amount so as to generate displacement in said actuator device, wherein said actuator device comprises a stack of piezoelectric-ferroelectric active layers separated by surface electrodes, wherein at least a few of said surface electrodes are independently addressable, and wherein said voltage is applied such as to induce a nonlinear ferroelectric effect on at least one of said layers.

* * * * *